United States Patent
Huo et al.

(10) Patent No.: US 10,164,037 B2
(45) Date of Patent: Dec. 25, 2018

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Ker-Hsiao Huo, Zhubei (TW); Kong-Beng Thei, Hsinchu County (TW); Chih-Wen Albert Yao, Hsinchu (TW); Fu-Jier Fan, Hsinchu (TW); Chen-Liang Chu, Hsinchu (TW); Ta-Yuan Kung, New Taipei (TW); Yi-Huan Chen, Hsinchu (TW); Yu-Bin Zhao, New Taipei (TW); Ming-Ta Lei, Hsinchu (TW); Li-Hsuan Yeh, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/475,294

(22) Filed: Mar. 31, 2017

(65) Prior Publication Data

US 2018/0286960 A1 Oct. 4, 2018

(51) Int. Cl.
*H01L 29/423* (2006.01)
*H01L 21/28* (2006.01)
*H01L 29/40* (2006.01)
*H01L 29/06* (2006.01)
*H01L 29/08* (2006.01)

(52) U.S. Cl.
CPC .... *H01L 29/4236* (2013.01); *H01L 21/28114* (2013.01); *H01L 29/0653* (2013.01); *H01L 29/0847* (2013.01); *H01L 29/401* (2013.01); *H01L 29/42376* (2013.01)

(58) Field of Classification Search
None
See application file for complete search history.

(56) References Cited

U.S. PATENT DOCUMENTS

| 2002/0003257 A1* | 1/2002 | Fu | H01L 21/28114 |
| | | | 257/329 |
| 2005/0001266 A1* | 1/2005 | Kim | H01L 21/823412 |
| | | | 257/330 |
| 2011/0180869 A1* | 7/2011 | Sanada | H01L 29/4236 |
| | | | 257/334 |

* cited by examiner

*Primary Examiner* — Whitney Moore
(74) *Attorney, Agent, or Firm* — McClure, Qualey & Rodack, LLP

(57) ABSTRACT

A semiconductor device structure is provided. The semiconductor device structure includes a semiconductor substrate having a top surface, a source region, and a drain region. The semiconductor device structure includes a gate structure over the top surface and extending into the semiconductor substrate. The gate structure in the semiconductor substrate is between the source region and the drain region and separates the source region from the drain region. The semiconductor device structure includes an isolation structure in the semiconductor substrate and surrounding the source region, the drain region, and the gate structure in the semiconductor substrate.

20 Claims, 35 Drawing Sheets

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1C-1 is a top view of the semiconductor device structure of FIG. 1C, in accordance with some embodiments.

FIG. 1H-1 is a top view of the semiconductor device structure of FIG. 1H, in accordance with some embodiments.

FIG. 1H-2 is a cross-sectional view illustrating the semiconductor device structure along a sectional line II-II' in FIG. 1H-1, in accordance with some embodiments.

FIG. 2C-1 is a top view of the semiconductor device structure of FIG. 2C, in accordance with some embodiments.

FIG. 2C-2 is a cross-sectional view illustrating the semiconductor device structure along a sectional line II-II' in FIG. 2C-1, in accordance with some embodiments.

FIG. 3D-1 is a top view of the semiconductor device structure of FIG. 3D, in accordance with some embodiments.

FIG. 3F-1 is a top view of the semiconductor device structure of FIG. 3F, in accordance with some embodiments.

FIG. 3F-2 is a cross-sectional view illustrating the semiconductor device structure along a sectional line II-II' in FIG. 3F-1, in accordance with some embodiments.

FIG. 4C-1 is a top view of the semiconductor device structure of FIG. 4C, in accordance with some embodiments.

FIG. 4C-2 is a cross-sectional view illustrating the semiconductor device structure along a sectional line II-II' in FIG. 4C-1, in accordance with some embodiments.

DETAILED DESCRIPTION

Figure 1A:
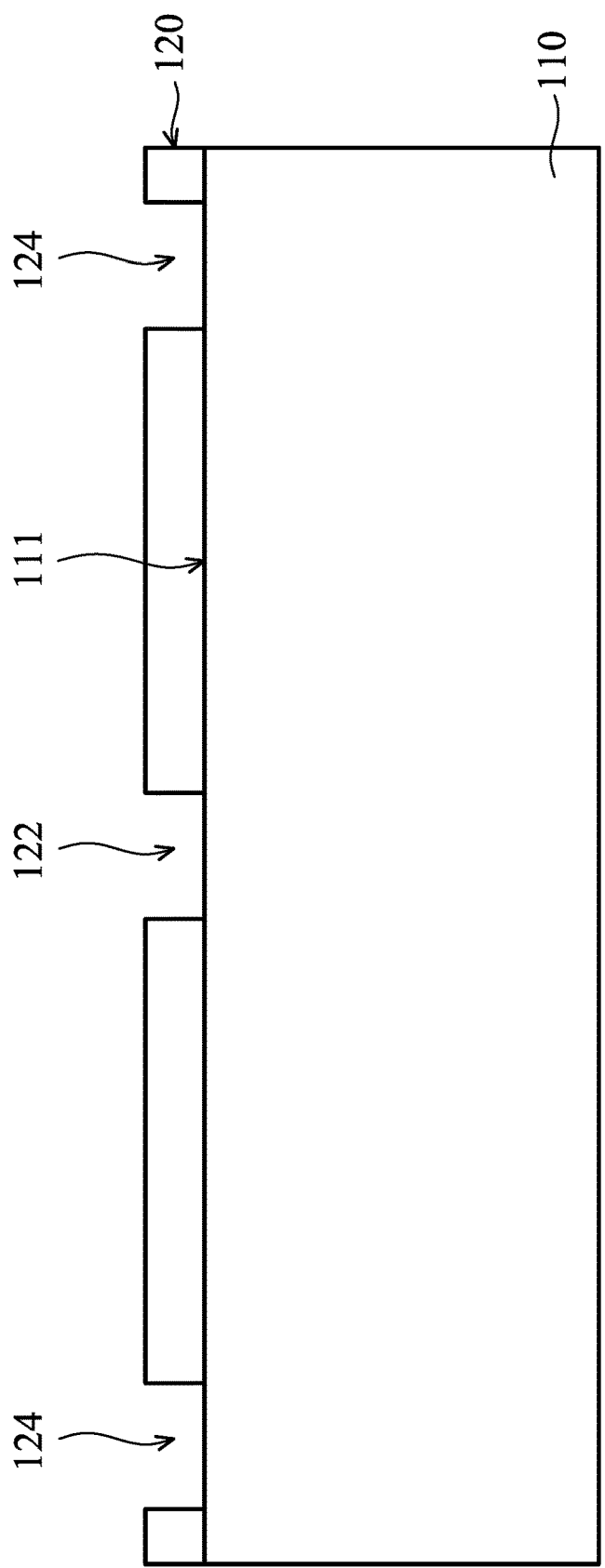
FIGS. 1A-1I are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1I are cross-sectional views of various stages of a process for forming a semiconductor device structure, in accordance with some embodiments. As shown in FIG. 1A, a semiconductor substrate 110 is provided. The semiconductor substrate 110 has a top surface 111, in accordance with some embodiments. The semiconductor substrate 110 may be a semiconductor wafer (such as a silicon wafer) or a portion of a semiconductor wafer.

In some embodiments, the semiconductor substrate 110 is made of an elementary semiconductor material (e.g., silicon or germanium) or a compound semiconductor (e.g., silicon carbide), an alloy semiconductor (e.g., SiGe, or GaAsP), or combinations thereof.

As shown in FIG. 1A, a mask layer 120 is formed over the top surface 111, in accordance with some embodiments. The mask layer 120 is also referred to as a hard mask layer, in accordance with some embodiments. The mask layer 120 is made of nitride or another suitable material. The mask layer 120 has openings 122 and 124, in accordance with some embodiments. The openings 122 and 124 expose a portion of the semiconductor substrate 110, in accordance with some embodiments.

Figure 1B:
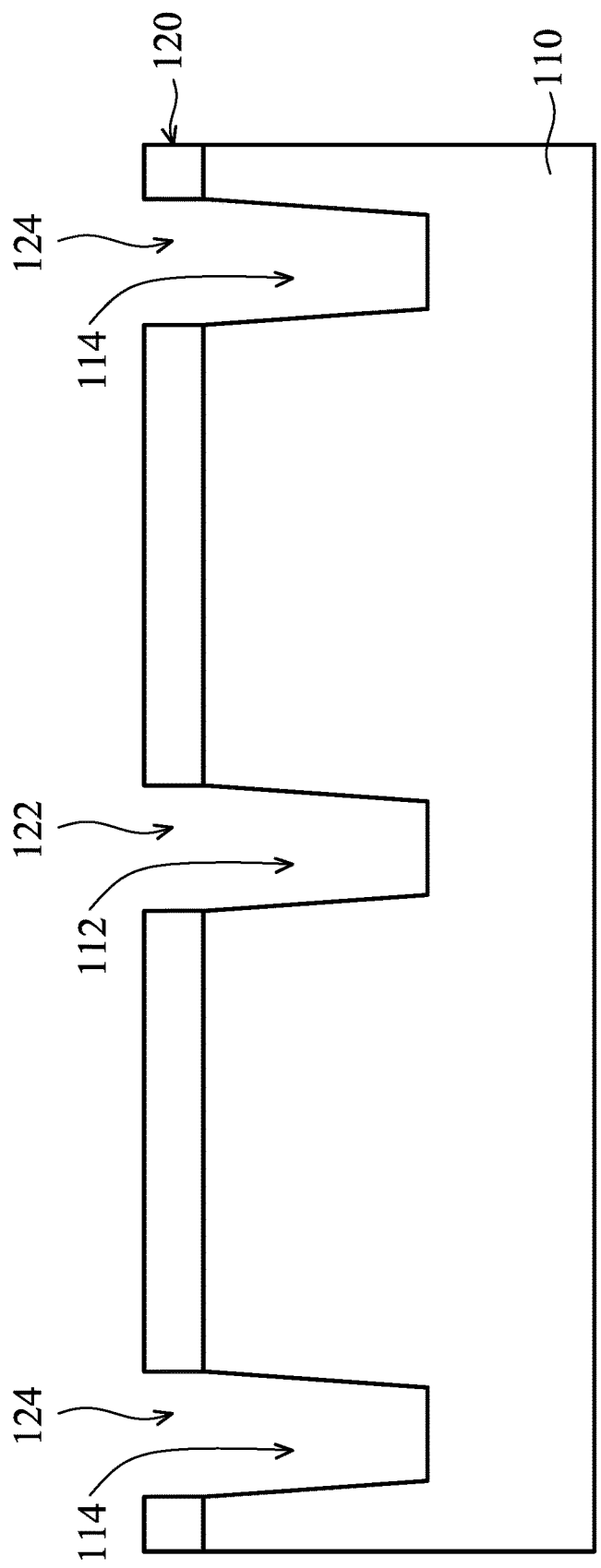

As shown in FIG. 1B, the portion of the semiconductor substrate 110 exposed by the openings 122 and 124 is removed to form trenches 112 and 114 in the semiconductor substrate 110, in accordance with some embodiments. The removal process is performed using an etching process, such as a dry etching process (e.g., a plasma etching process), in accordance with some embodiments. The trenches 112 and 114 are formed by a same etching process, in accordance with some embodiments.

Figure 1C:
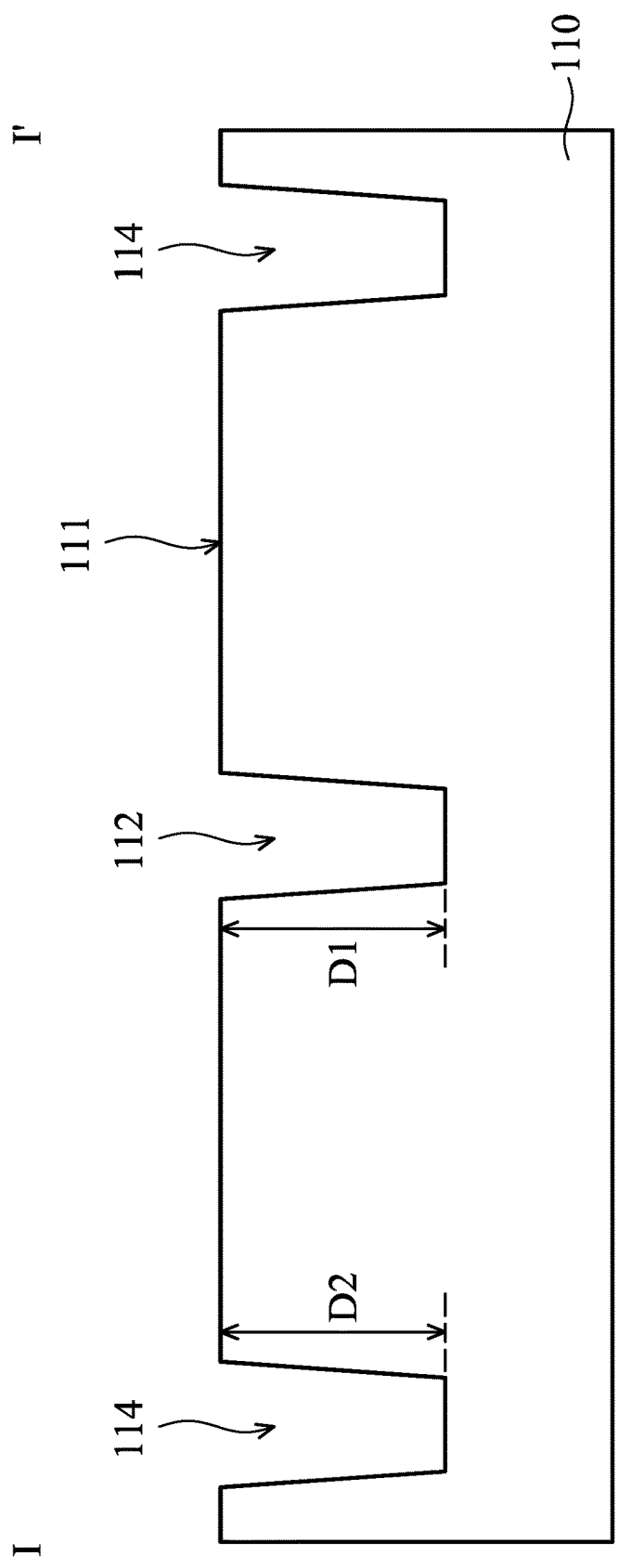
Figures 1, 1C:
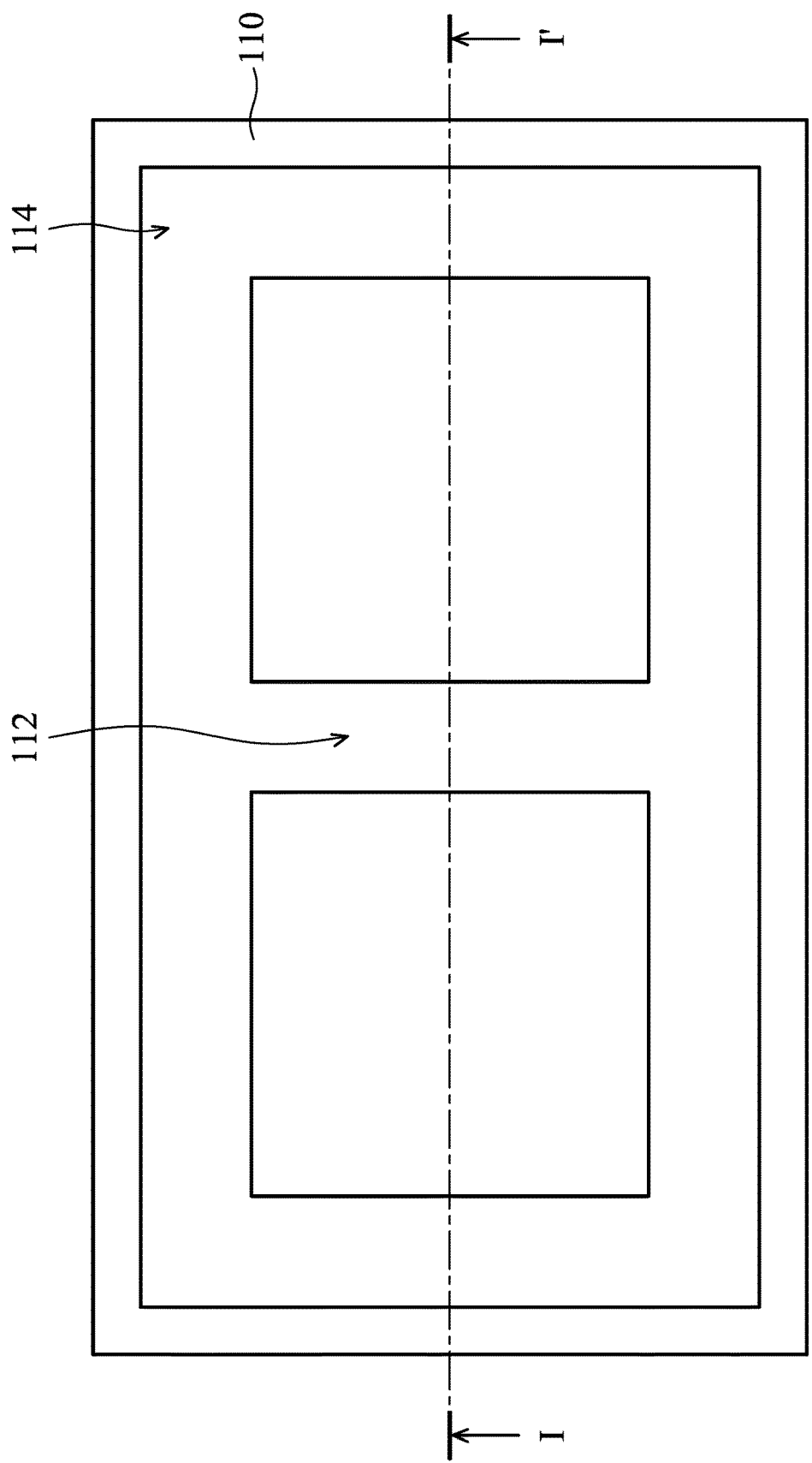

FIG. 1C-1 is a top view of the semiconductor device structure of FIG. 1C, in accordance with some embodiments. FIG. 1C is a cross-sectional view illustrating the semiconductor device structure along a sectional line I-I' in FIG. 1C-1, in accordance with some embodiments.

As shown in FIGS. 1C and 1C-1, the mask layer 120 is removed, in accordance with some embodiments. As shown in FIGS. 1C and 1C-1, the trench 114 surrounds the trench 112, in accordance with some embodiments. The trench 114 communicates with the trench 112, in accordance with some embodiments.

In some embodiments, a depth D1 of the trench 112 is substantially equal to a depth D2 of the trench 114. The term "substantially equal to" means a ratio of the difference between the depths D1 and D2 to the depth D1 or D2 ranges from about −5% to about 5%, in accordance with some embodiments. The depth D1 or D2 ranges from about 0.15 μm to about 0.45 μm, in accordance with some embodiments. The depth D1 or D2 ranges from about 0.2 μm to about 0.4 μm, in accordance with some embodiments.

Figure 1D:
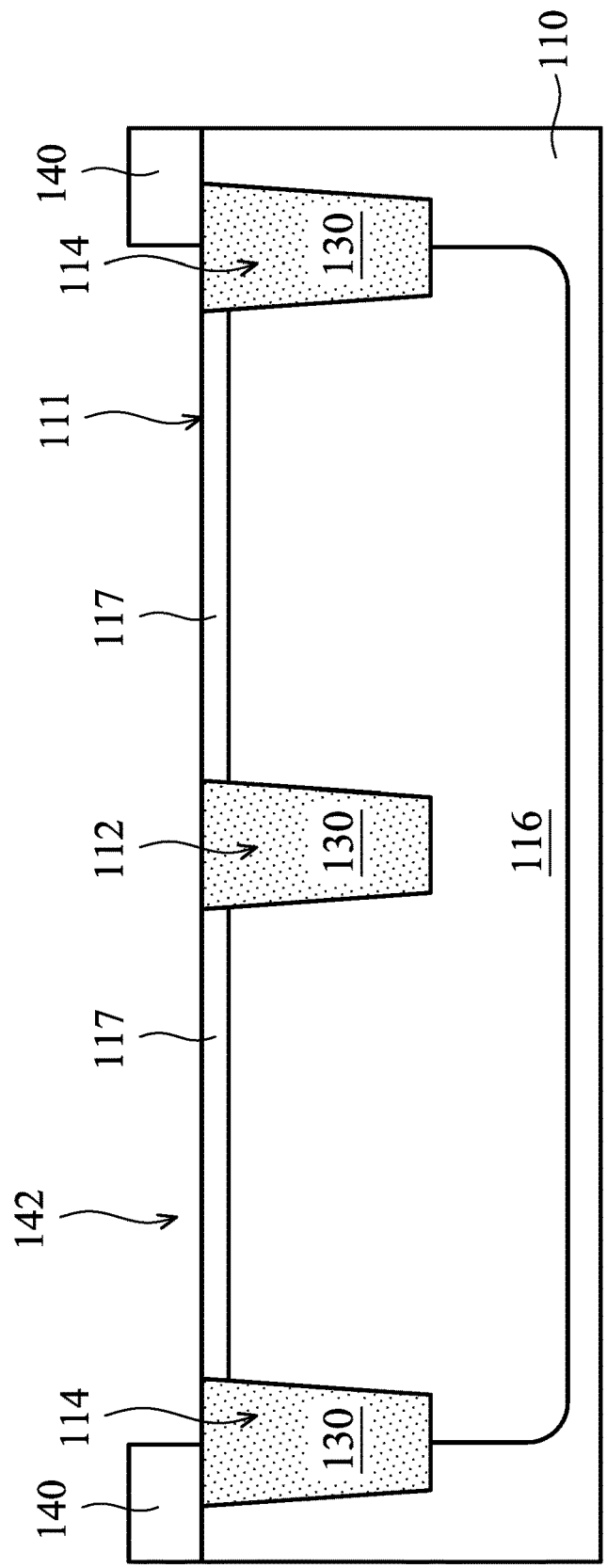

As shown in FIG. 1D, an isolation structure 130 is formed in the trenches 112 and 114, in accordance with some embodiments. The trenches 112 and 114 are filled up with the isolation structure 130, in accordance with some embodiments. The isolation structure 130 is made of a dielectric material, such as silicon oxide, in accordance with some embodiments.

As shown in FIG. 1D, a mask layer 140 is formed over the top surface 111, in accordance with some embodiments. The mask layer 140 has an opening 142, in accordance with some embodiments. The opening 142 exposes the semiconductor substrate 110 surrounded by the trench 114, in accordance with some embodiments.

As shown in FIG. 1D, an ion implantation process is performed to implant first type dopants into the semiconductor substrate 110 surrounded by the trench 114 to form a first type well 116, in accordance with some embodiments. The first type dopants and the first type well 116 have a first type conductivity, in accordance with some embodiments.

In some embodiments, the first type conductivity is a P-type conductivity, and the first type dopants and the first type well 116 are P-type dopants and a P-type well. The P-type dopants are made of boron (B), aluminum (Al), gallium (Ga), indium (In), and thallium (Tl), in accordance with some embodiments.

In some other embodiments, the first type conductivity is an N-type conductivity, and the first type dopants and the first type well 116 are N-type dopants and N-type well. The N-type dopants are made of nitrogen (N), phosphorus (P), arsenic (As), antimony (Sb), or bismuth (Bi), in accordance with some embodiments.

As shown in FIG. 1D, an ion implantation process is performed to implant second type dopants into the semiconductor substrate 110, in accordance with some embodiments. The second type lightly doped region 117 is formed in the semiconductor substrate 110 surrounded by the trench 114, in accordance with some embodiments. The second type dopants and the second type lightly doped regions 117 have a second type conductivity, in accordance with some embodiments.

The second type conductivity is different from the first type conductivity, in accordance with some embodiments. For example, if the first type conductivity is a P-type conductivity, the second type conductivity is an N-type conductivity. If the first type conductivity is an N-type conductivity, the second type conductivity is a P-type conductivity.

In some embodiments, the second type conductivity is an N-type conductivity, and the second type dopants are made of nitrogen (N) or another group VA element. In some other embodiments, the second type conductivity is a P-type conductivity, and the second type dopants are made of boron (B) or another group IIIA element.

Figure 1E:
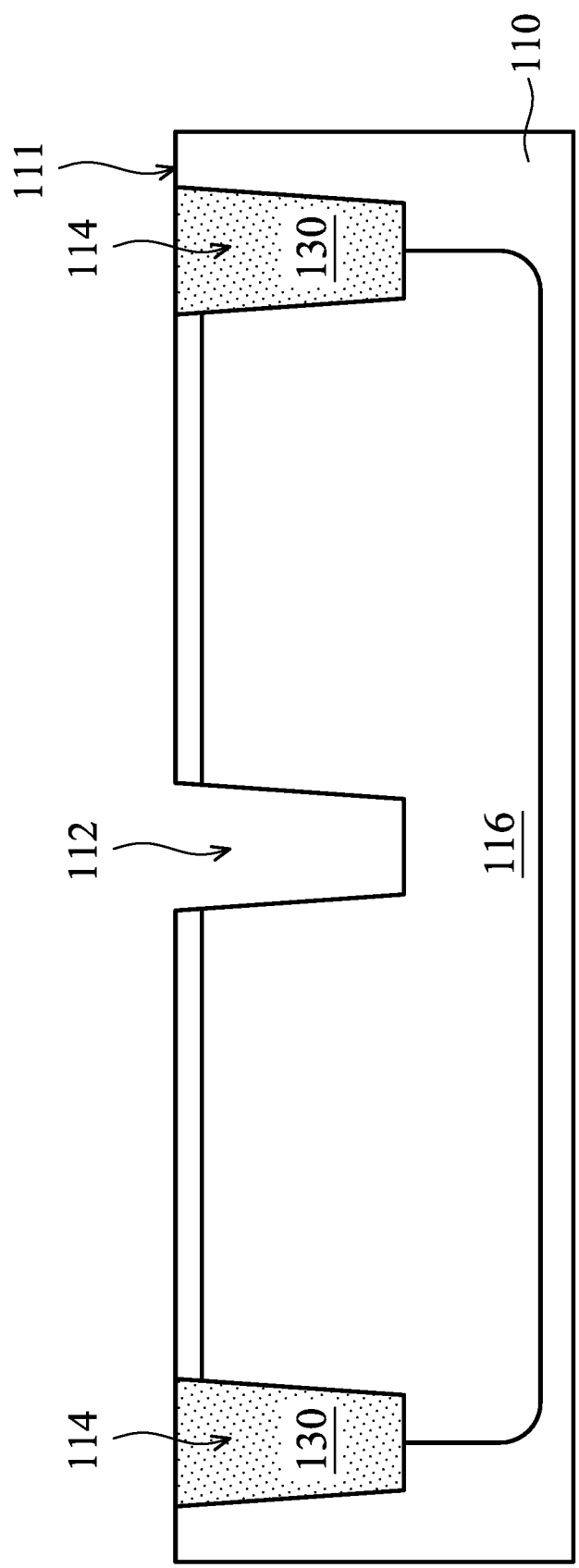

As shown in FIG. 1E, the mask layer 140 is removed, in accordance with some embodiments. As shown in FIG. 1E, the isolation structure 130 in the trench 112 is removed, in accordance with some embodiments.

Figure 1F:
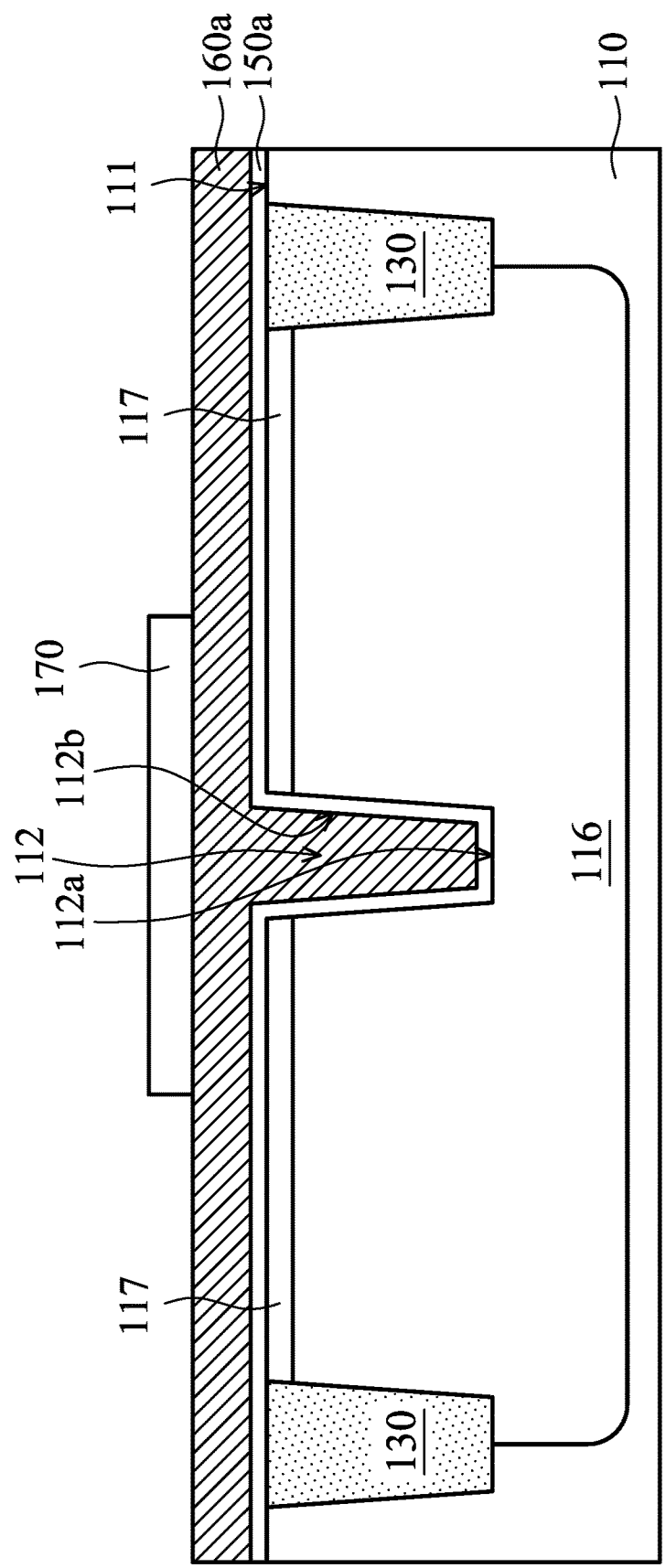

As shown in FIG. 1F, a gate dielectric material layer 150a is conformally deposited over the top surface 111 of the semiconductor substrate 110 and a bottom surface 112a and inner walls 112b of the trench 112, in accordance with some embodiments. The gate dielectric material layer 150a is made of silicon oxide or another suitable insulating material.

As shown in FIG. 1F, a gate material layer 160a is deposited over the gate dielectric material layer 150a, in accordance with some embodiments. The gate material layer 160a is made of a conductive material, such as a semiconductor material (e.g., polysilicon), in accordance with some embodiments.

As shown in FIG. 1F, a mask layer 170 is formed over the gate material layer 160a, in accordance with some embodiments. The mask layer 170 exposes a portion of the gate material layer 160a, in accordance with some embodiments. In some embodiments, the mask layer 170 includes oxide or nitride, such as silicon oxide, silicon oxynitride, silicon nitride, or the like.

Figure 1G:
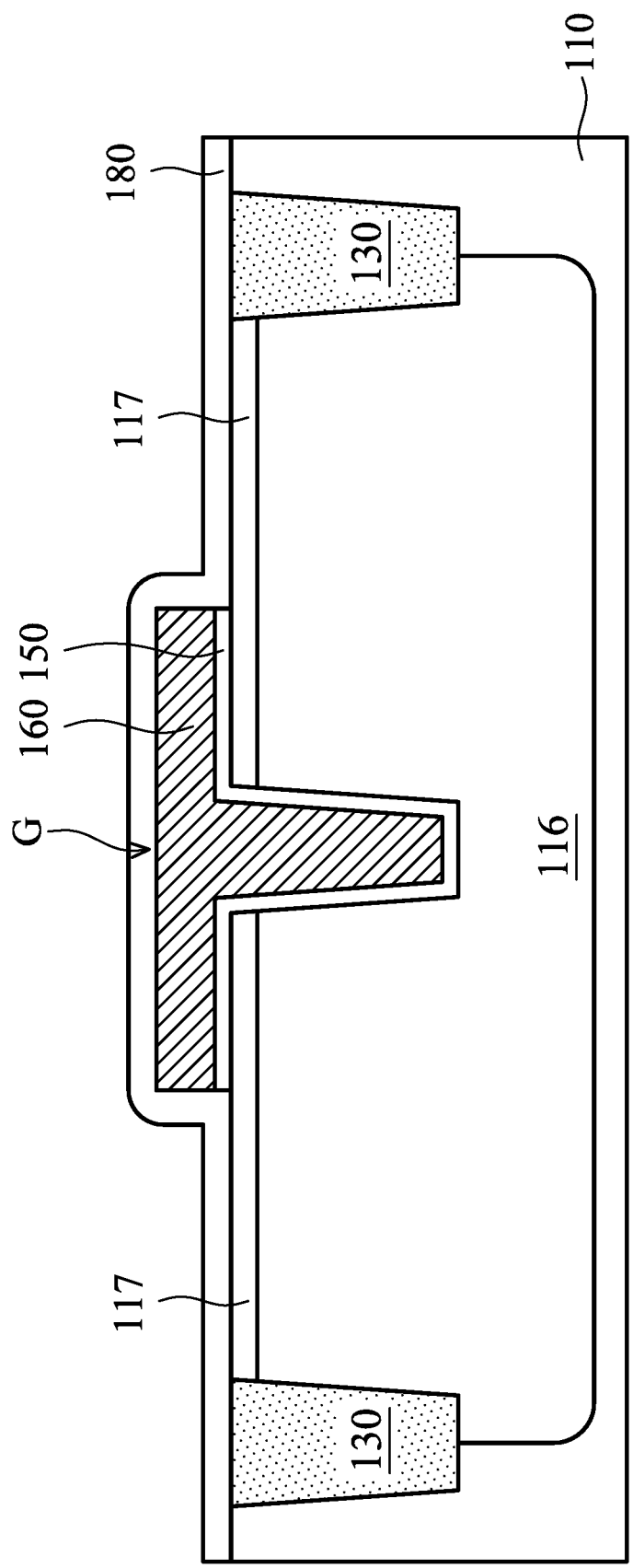

As shown in FIG. 1G, the gate material layer 160a exposed by the mask layer 170 is removed, and the gate dielectric material layer 150a under the removed gate material layer 160a is also removed, in accordance with some embodiments. The gate material layer 160a and the gate dielectric material layer 150a remaining under the mask layer 170 form a gate electrode 160 and a gate dielectric layer 150, in accordance with some embodiments. The gate electrode 160 and the gate dielectric layer 150 together form a gate structure G, in accordance with some embodiments.

As shown in FIG. 1G, the mask layer 170 is removed, in accordance with some embodiments. As shown in FIG. 1G, a spacer layer 180 is deposited over the gate structure G and the semiconductor substrate 110, in accordance with some embodiments. The spacer layer 180 includes insulating materials, such as silicon oxides or silicon nitrides, in accordance with some embodiments.

Figure 1H:
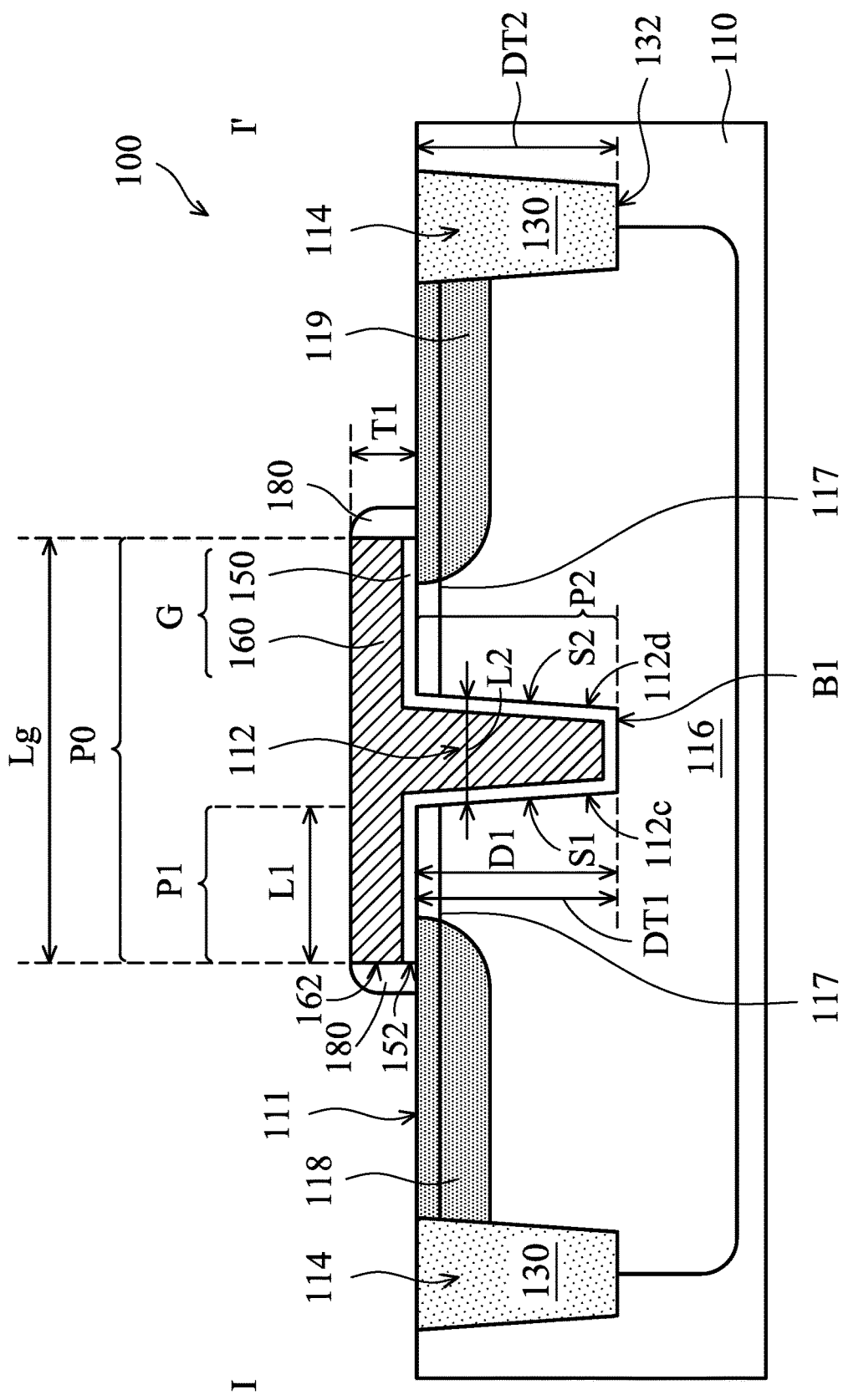
Figures 1, 1H:
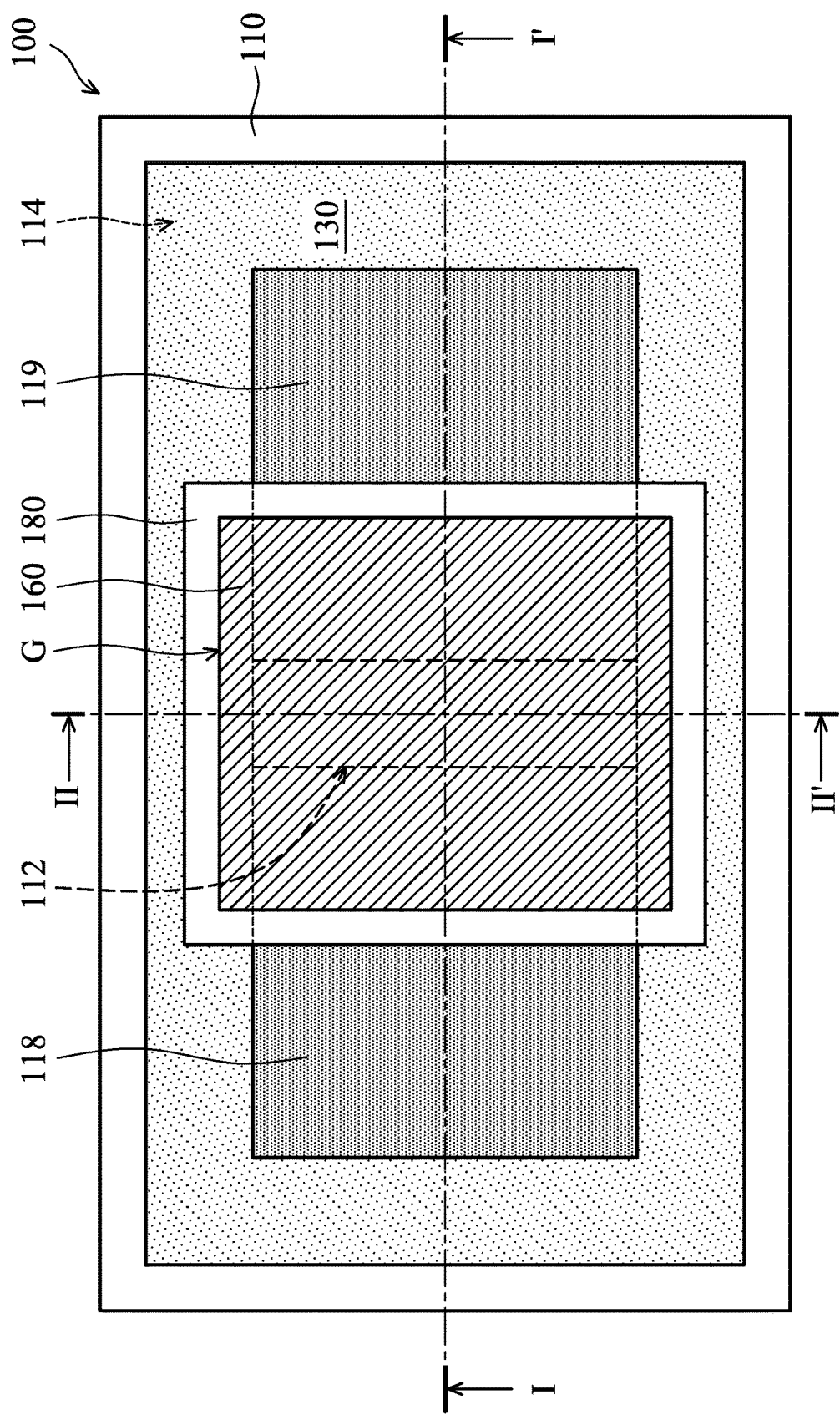
Figures 1, 1H, 2:
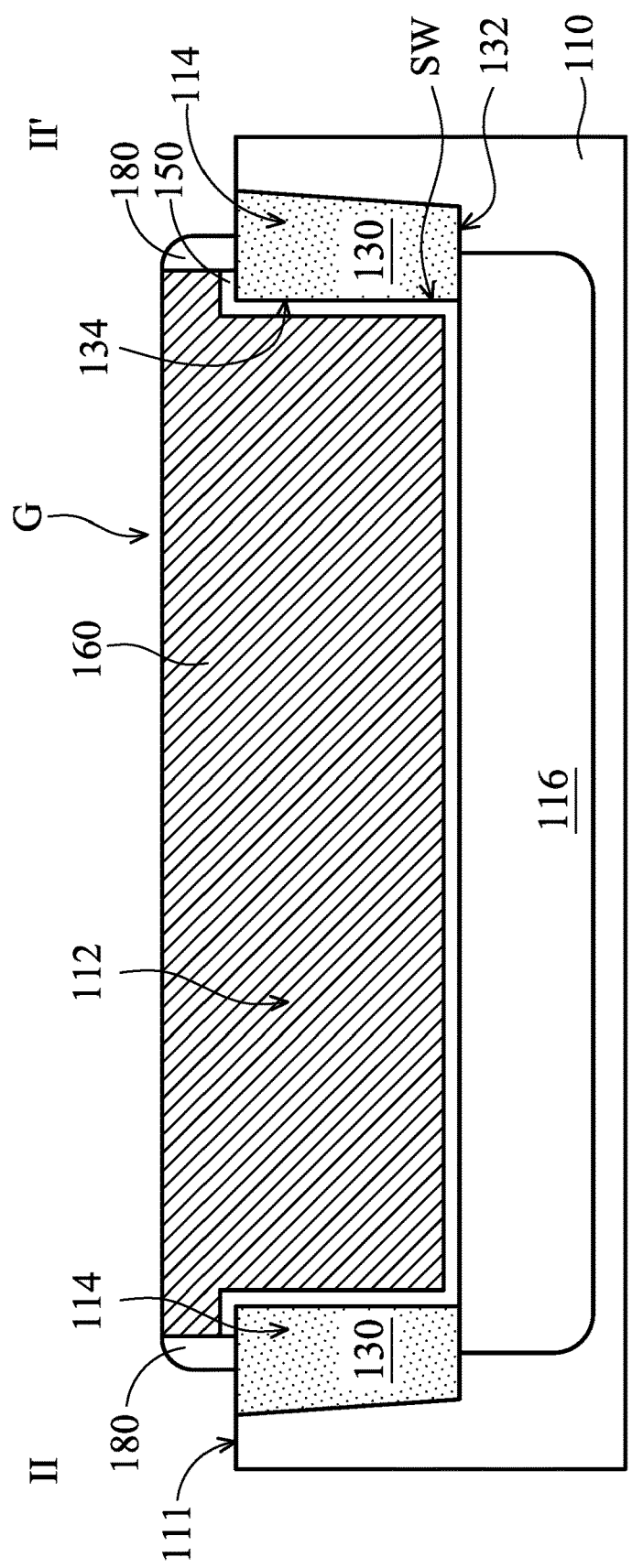

FIG. 1H-1 is a top view of the semiconductor device structure of FIG. 1H, in accordance with some embodiments. FIG. 1H is a cross-sectional view illustrating the semiconductor device structure along a sectional line I-I' in FIG. 1H-1, in accordance with some embodiments. FIG. 1H-2 is a cross-sectional view illustrating the semiconductor device structure along a sectional line II-II' in FIG. 1H-1, in accordance with some embodiments.

As shown in FIG. 1H, an anisotropic etching process (e.g. a dry etching process) is performed to remove a portion of the spacer layer 180. The remaining spacer layer 180 is over sidewalls 162 and 152 of the gate electrode 160 and the gate dielectric layer 150. The spacer layer 180 only surrounds the gate structure G over the top surface 111 and does not surround the gate structure G in the semiconductor substrate 110, in accordance with some embodiments. The spacer layer 180 over the sidewalls 162 and 152 is configured to electrically isolate the gate electrode 160 from other devices and to act as a mask layer in a subsequent ion implantation process.

As shown in FIGS. 1H and 1H-1, second type heavily doped regions 118 and 119 are formed in the semiconductor substrate 110 by using a suitable process, such as an ion implantation process. The second type heavily doped regions 118 and 119 are a source region and a drain region, respectively, in accordance with some embodiments. The second type heavily doped regions 118 and 119 are located at the two opposite sides of the gate structure G.

The gate structure G, the spacer layer 180, the first type well 116, the second type lightly doped regions 117, and the second type heavily doped regions 118 and 119 together constitute a transistor device 100, in accordance with some embodiments.

The trench 112 and the gate structure G are between the second type heavily doped regions 118 and 119, in accordance with some embodiments. The trench 112 and the gate structure G physically and electrically separate the second type heavily doped region 118 from the second type heavily doped region 119, in accordance with some embodiments. Therefore, the gate structure G extending into the semiconductor substrate 110 improves the breakdown voltage of the transistor device 100 or reduces the gate length Lg when maintaining a required breakdown voltage.

The second type heavily doped regions 118 and 119 are doped with second type dopants, in accordance with some embodiments. The second type dopants and the second type heavily doped regions 118 and 119 have a second type conductivity, in accordance with some embodiments.

The second type conductivity is different from the first type conductivity, in accordance with some embodiments. For example, if the first type conductivity is a P-type conductivity, the second type conductivity is an N-type conductivity. If the first type conductivity is an N-type conductivity, the second type conductivity is a P-type conductivity.

In some embodiments, the second type conductivity is an N-type conductivity, and the second type dopants are made of nitrogen (N) or another group VA element. In some other embodiments, the second type conductivity is a P-type conductivity, and the second type dopants are made of boron (B) or another group IIIA element.

The gate structure G is formed in the trench 112 and extends to the top surface 111, in accordance with some embodiments. The trench 112 has opposite sides 112c and 112d, in accordance with some embodiments. The opposite sides 112c and 112d respectively face the second type heavily doped regions 118 and 119, in accordance with some embodiments. The gate structure G in the trench 112 has opposite sides S1 and S2, in accordance with some embodiments. The opposite sides S1 and S2 respectively face the second type heavily doped regions 118 and 119, in accordance with some embodiments.

In some embodiments, a portion P1 of the gate structure G over the top surface 111 and on the side 112c or S1 has a length L1. The depth D1 of the trench 112 is greater than the length L1, in accordance with some embodiments. In some embodiments, a portion P2 of the gate structure G in the trench 112 has a bottom surface B1.

In some embodiments, a distance DT1 between the bottom surface B1 and the top surface 111 is greater than the length L1. A ratio of the distance DT1 (or the depth D1) to the length L1 ranges from about 1.3 to about 1.5, in accordance with some embodiments. In some embodiments, a distance DT2 between a bottom surface 132 of the isolation structure 130 and the top surface 111 is substantially equal to the distance DT1.

In some embodiments, a portion P0 of the gate structure G over the top surface 111 has a length Lg, the portion P2 of the gate structure G in the trench 112 has a length L2, and the length Lg is greater than the length L2. In some embodiments, as shown in FIG. 1H, the gate structure G has a T-shaped cross section.

As shown in FIGS. 1H-1 and 1H-2, the gate structure G is partially over the isolation structure 130, in accordance with some embodiments. The isolation structure 130 surrounds the gate structure G in the trench 112, in accordance with some embodiments. The isolation structure 130 is in direct contact with the gate structure G (or the gate dielectric layer 150), in accordance with some embodiments.

The gate structure G has a sidewall SW, in accordance with some embodiments. The isolation structure 130 has a sidewall 134, in accordance with some embodiments. The sidewalls SW and 134 face to each other, in accordance with some embodiments. The sidewalls SW and 134 are in direct contact with each other, in accordance with some embodiments. As shown in FIG. 1H, the depth D1 of the trench 112 is greater than the thickness T1 of the gate structure G over the top surface 111, in accordance with some embodiments.

Figure 1I:
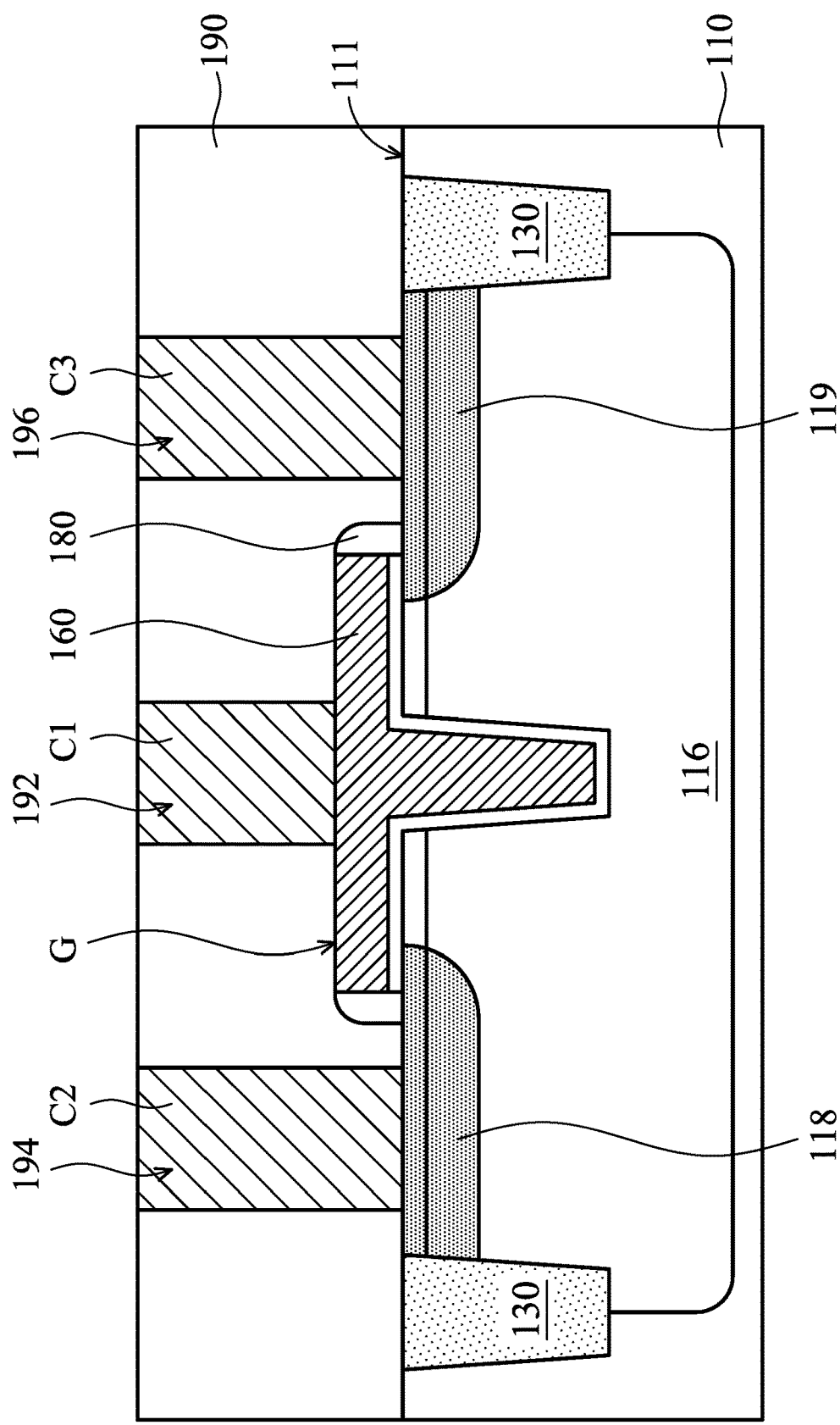

As shown in FIG. 1I, a dielectric layer 190 is formed over the semiconductor substrate 110, the gate structure G, and the spacer layer 180, in accordance with some embodiments. The dielectric layer 190 is made of silicon oxide, silicon oxynitride, or another suitable dielectric material.

As shown in FIG. 1I, portions of the dielectric layer 190 are removed to form through holes 192, 194, and 196 in the dielectric layer 190, in accordance with some embodiments. The through holes 192, 194, and 196 respectively expose the gate structure G and the second type heavily doped regions 118 and 119, in accordance with some embodiments.

As shown in FIG. 1I, conductive structures C1, C2, and C3 are respectively formed in the through holes 192, 194, and 196, in accordance with some embodiments. The through holes 192, 194, and 196 are filled up with the conductive structures C1, C2, and C3, respectively, in accordance with some embodiments. The conductive structures C1, C2, and C3 are respectively electrically connected to the gate electrode 160 and the second type heavily doped regions 118 and 119, in accordance with some embodiments. The conductive structures C1, C2, and C3 are made of tungsten, copper, or other suitable conductive materials.

Figure 2A:
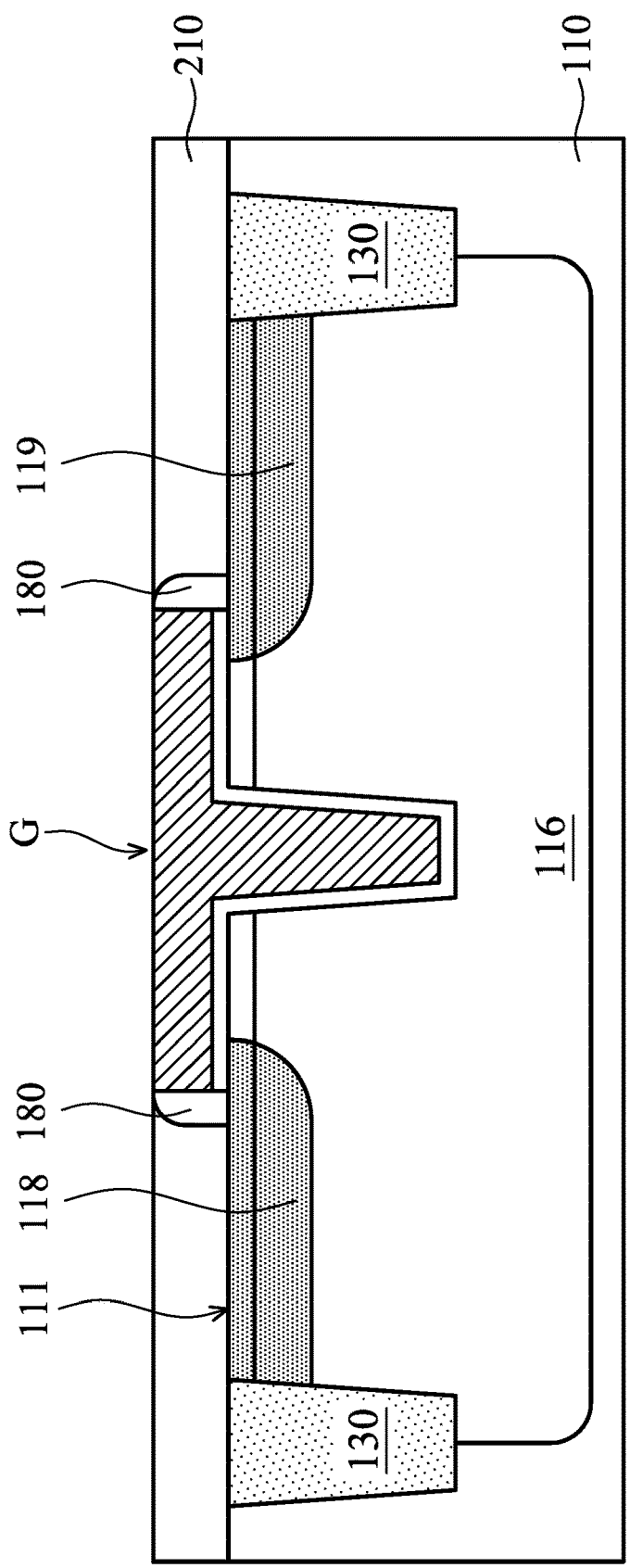
FIGS. 2A-2D are cross-sectional views of various stages of a process for forming a semiconductor device structure, in accordance with some embodiments.

FIGS. 2A-2D are cross-sectional views of various stages of a process for forming a semiconductor device structure, in accordance with some embodiments. As shown in FIG. 2A, after the step of FIG. 1H, a dielectric layer 210 is formed over the top surface 111 and surrounds the gate structure G, in accordance with some embodiments. The dielectric layer 210 is made of silicon oxide, silicon oxynitride, borosilicate glass (BSG), or another suitable dielectric material.

Figure 2B:
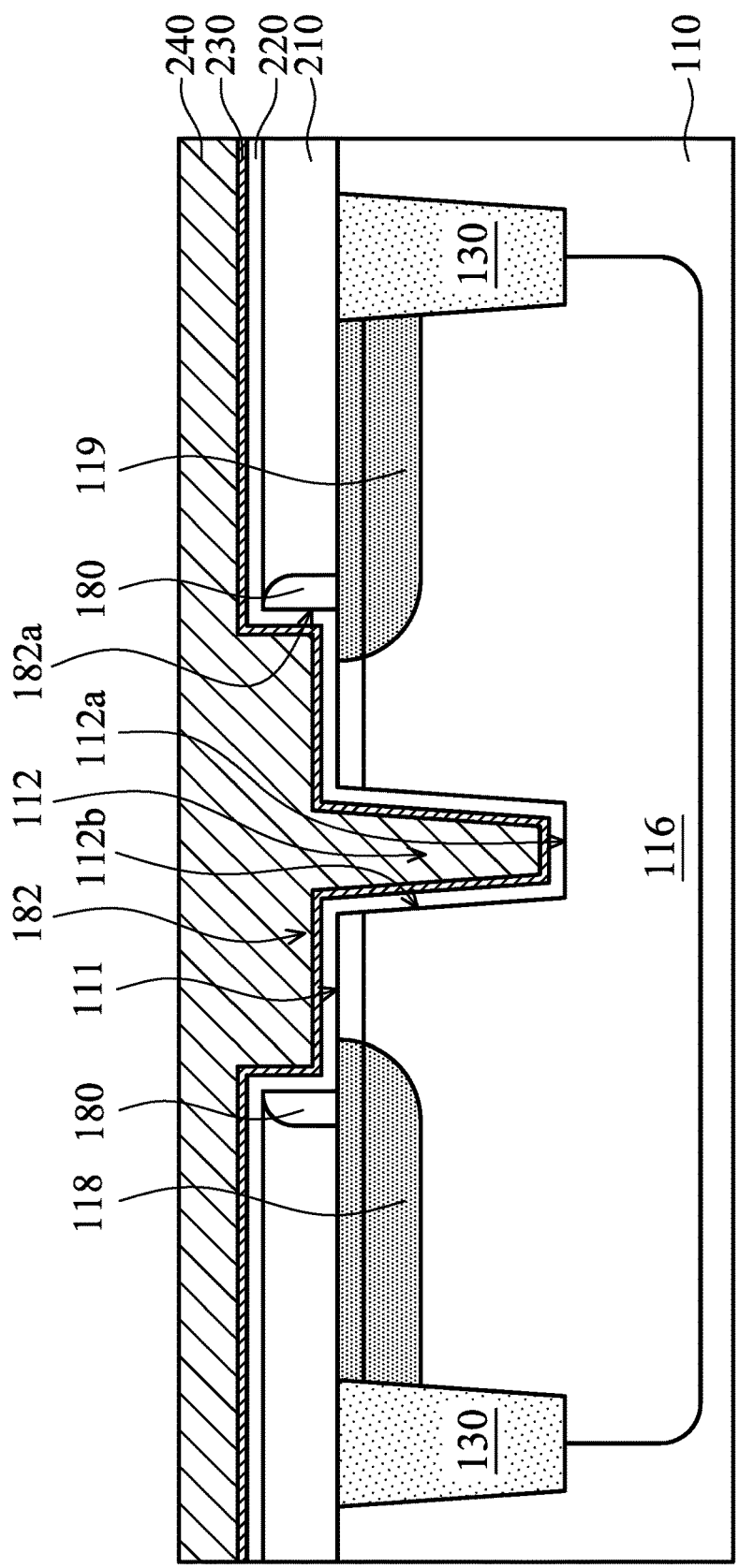

As shown in FIG. 2B, the gate structure G is removed to form an opening 182 in the spacer layer 180, in accordance with some embodiments. As shown in FIG. 2B, a gate dielectric layer 220 is deposited over the dielectric layer 210 and the spacer layer 180 and in the opening 182 and the trench 112, in accordance with some embodiments.

The gate dielectric layer 220 conformally covers the inner walls 182a of the opening 182, the top surface 111 exposed by the opening 182, and the bottom surface 112a and the inner walls 112b of the trench 112, in accordance with some embodiments.

As shown in FIG. 2B, a work function metal layer 230 is deposited over the gate dielectric layer 220, in accordance with some embodiments. The work function metal layer 230 provides a desired work function for transistors to enhance device performance including improved threshold voltage.

In the embodiments of forming a PMOS transistor, the work function metal layer 230 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, another suitable material, or a combination thereof.

On the other hand, in the embodiments of forming an NMOS transistor, the work function metal layer 230 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof. The work function metal layer 230 is made of hafnium, zirconium, or another suitable material.

As shown in FIG. 2B, a gate electrode layer 240 (also called a metal gate electrode layer) is deposited over the work function metal layer 230 to fill the opening 182 and the trench 112, in accordance with some embodiments. The gate electrode layer 240 includes a suitable metal material, such as aluminum, tungsten, gold, platinum, cobalt, another suitable metal, an alloy thereof, or a combination thereof, in accordance with some embodiments.

Figure 2C:
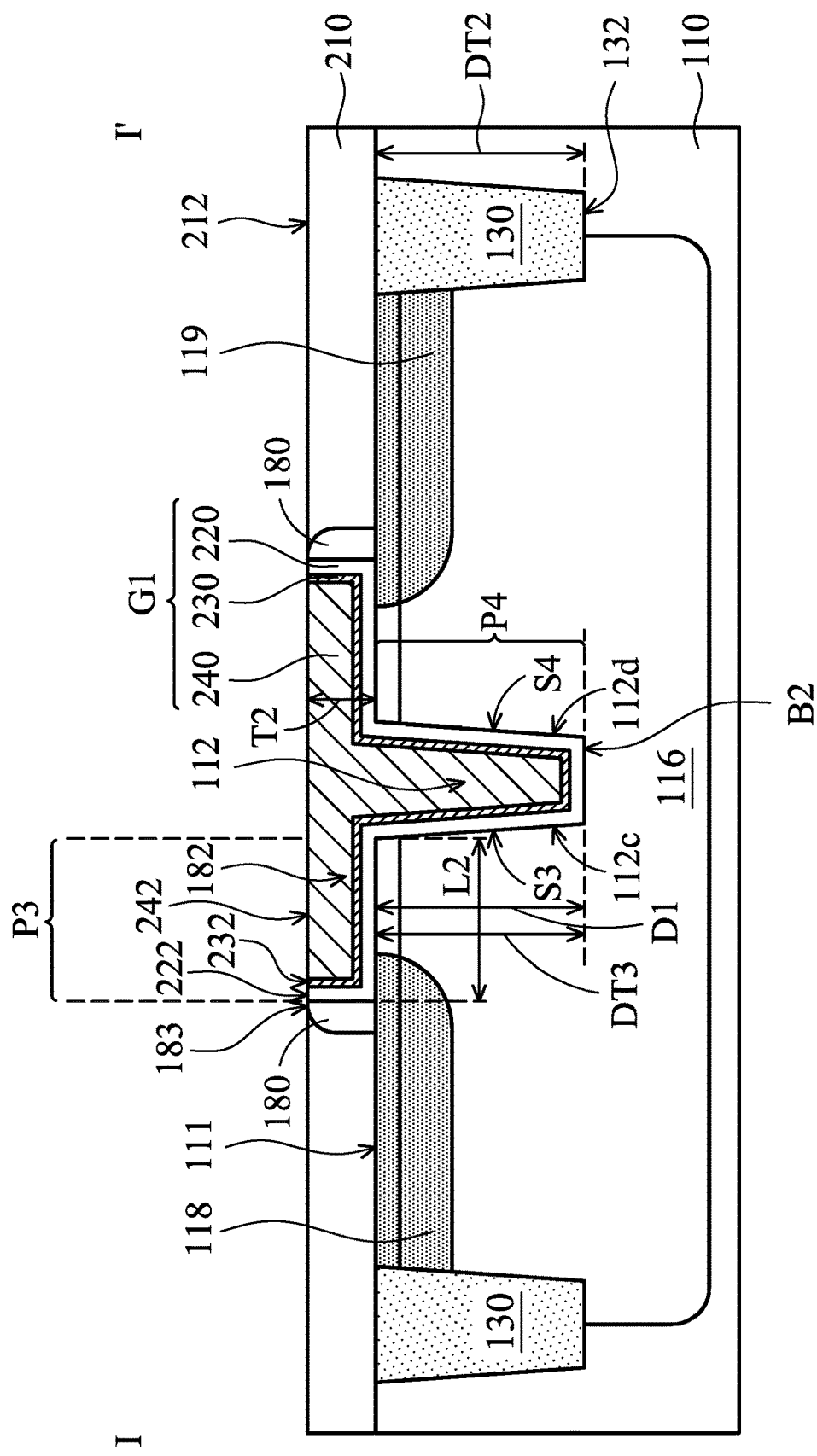
Figures 1, 2C:
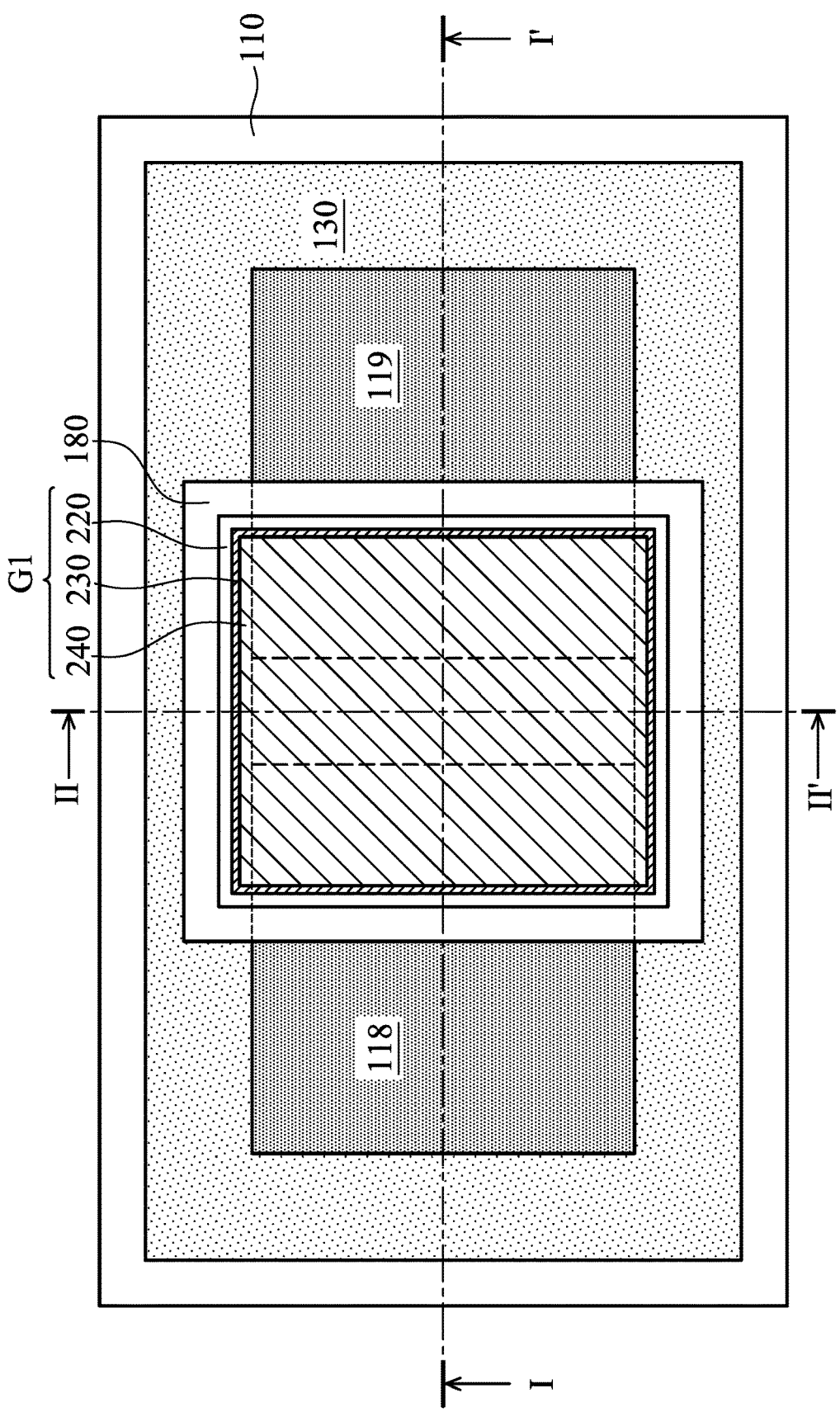
Figures 2, 2C:
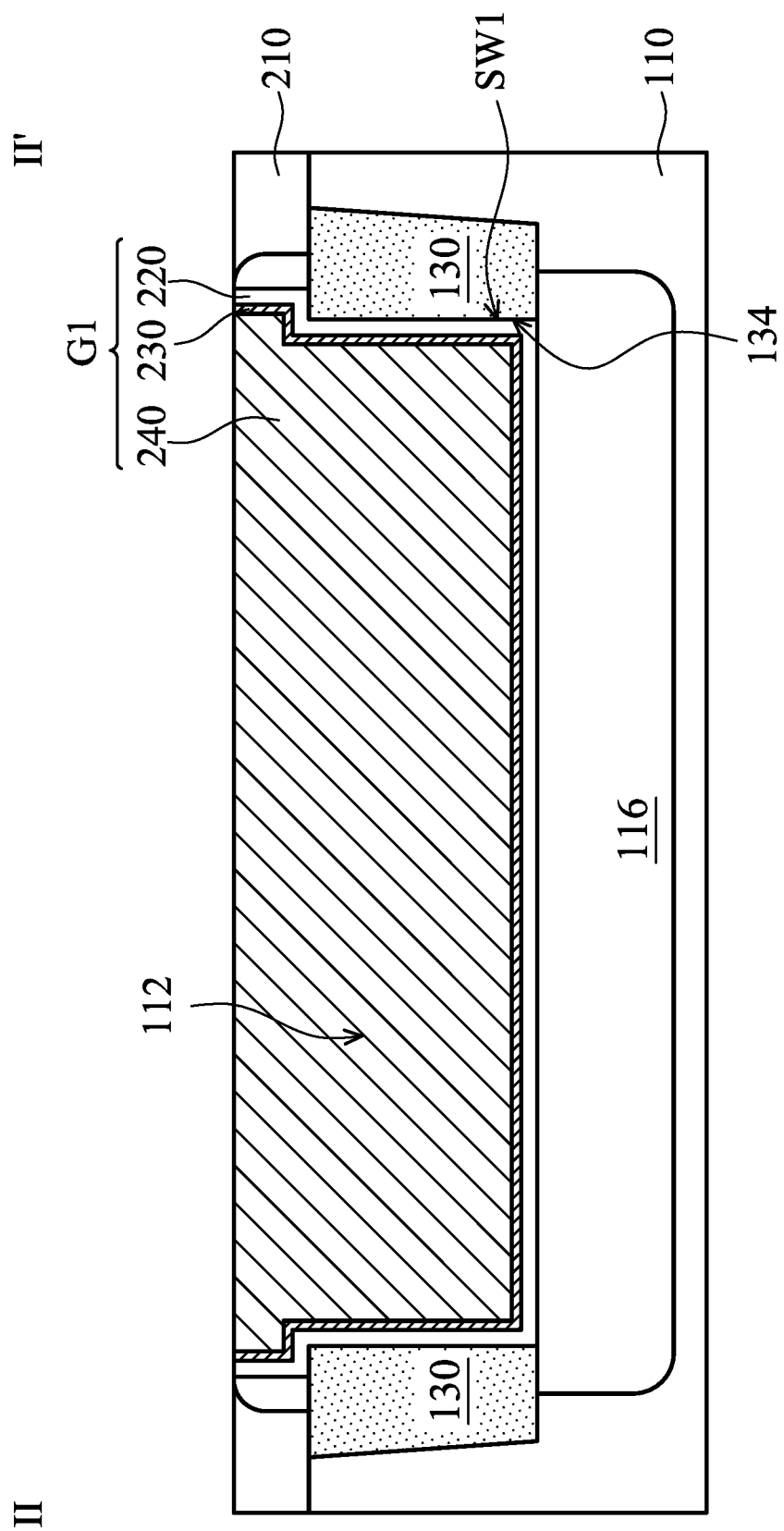

FIG. 2C-1 is a top view of the semiconductor device structure of FIG. 2C, in accordance with some embodiments. FIG. 2C is a cross-sectional view illustrating the semiconductor device structure along a sectional line I-I' in FIG. 2C-1, in accordance with some embodiments. FIG. 2C-2 is a cross-sectional view illustrating the semiconductor device structure along a sectional line II-II' in FIG. 2C-1, in accordance with some embodiments. For the sake of simplicity, FIG. 2C-1 does not show the dielectric layer 210, in accordance with some embodiments.

As shown in FIGS. 2C, 2C-1, and 2C-2, a planarization process is performed to remove the gate electrode layer 240, the work function metal layer 230, and the gate dielectric layer 220 outside of the opening 182 and the trench 112, in accordance with some embodiments. In some embodiments, top surfaces 242, 232, 222, 183, and 212 of the gate electrode layer 240, the work function metal layer 230, the gate dielectric layer 220, the spacer layer 180, and the dielectric layer 210 are coplanar, in accordance with some embodiments. The planarization process includes a chemical mechanical polishing (CMP) process or the like, in accordance with some embodiments.

The gate electrode layer 240, the work function metal layer 230, and the gate dielectric layer 220 in the opening 182 and the trench 112 together form a gate structure G1, in accordance with some embodiments.

The gate structure G1 is formed in the trench 112 and extends to the top surface 111, in accordance with some embodiments. The gate structure G1 in the trench 112 has opposite sides S3 and S4, in accordance with some embodiments. The sides S3 and S4 respectively face the second type heavily doped regions 118 and 119, in accordance with some embodiments.

In some embodiments, a portion P3 of the gate structure G1 over the top surface 111 and on the side 112c or S3 has a length L2. The depth D1 of the trench 112 is greater than the length L2, in accordance with some embodiments. A ratio of the depth D1 to the length L2 ranges from about 1.3 to about 1.5, in accordance with some embodiments.

In some embodiments, a portion P4 of the gate structure G1 in the trench 112 has a bottom surface B2. In some embodiments, a distance DT3 between the bottom surface B2 and the top surface 111 is greater than the length L2. In some embodiments, the distance DT2 between the bottom surface 132 of the isolation structure 130 and the top surface 111 is substantially equal to the distance DT3.

As shown in FIGS. 2C-1 and 2C-2, the gate structure G1 is partially over the isolation structure 130, in accordance with some embodiments. As shown in FIGS. 2C, 2C-1, and 2C-2, the isolation structure 130 surrounds the gate structure G1 in the trench 112, in accordance with some embodiments. As shown in FIGS. 2C-1 and 2C-2, the isolation structure 130 is in direct contact with the gate structure G1 (or the gate dielectric layer 220), in accordance with some embodiments.

The gate structure G1 has a sidewall SW1, in accordance with some embodiments. The sidewall SW1 and the sidewall 134 of the isolation structure 130 face to each other, in accordance with some embodiments. The sidewalls SW1 and 134 are in direct contact with each other, in accordance with some embodiments. As shown in FIG. 2C, the depth D1 of the trench 112 is greater than the thickness T2 of the gate structure G1 over the top surface 111, in accordance with some embodiments.

Figure 2D:
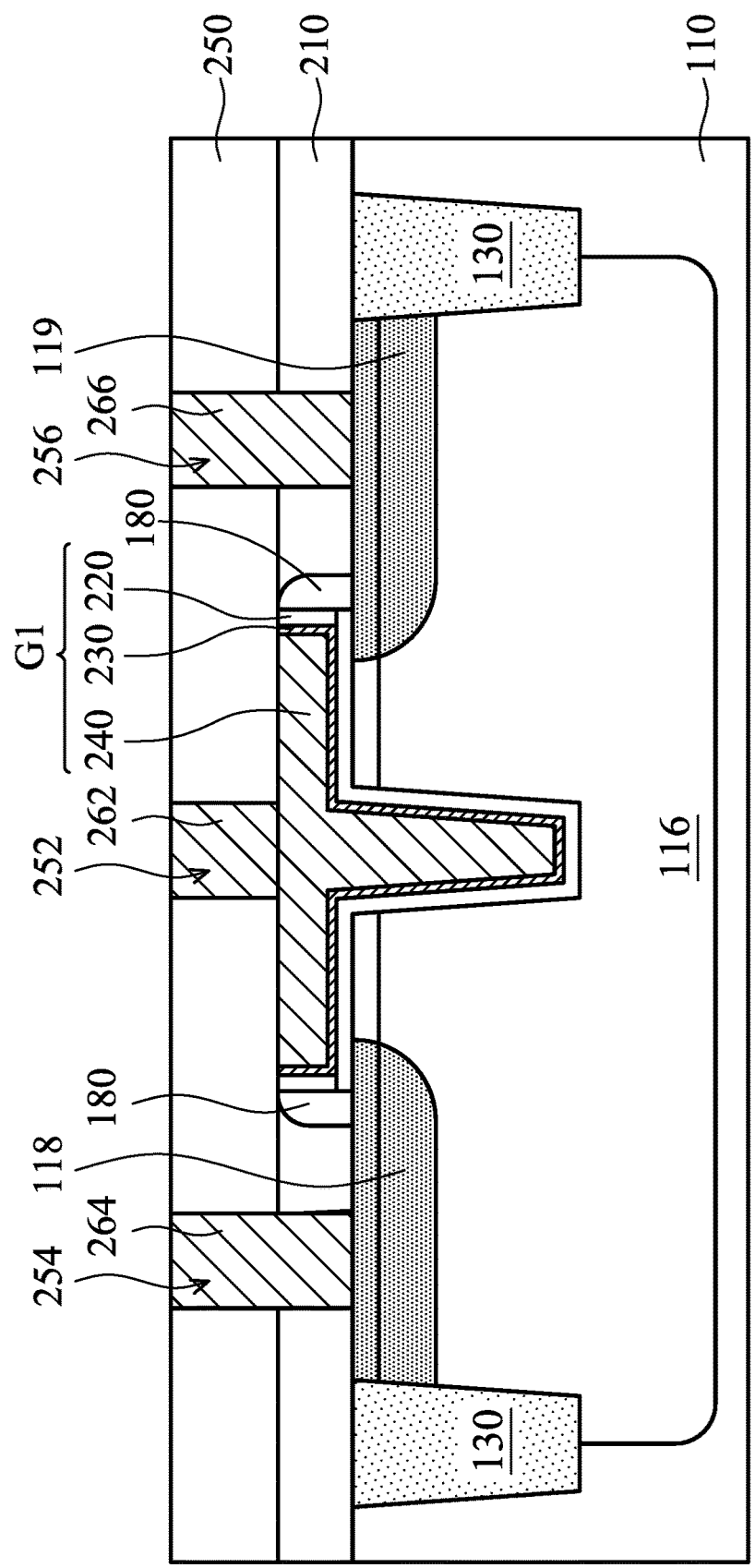

As shown in FIG. 2D, a dielectric layer 250 is formed over the gate structure G1, the dielectric layer 210, and the spacer layer 180, in accordance with some embodiments. The dielectric layer 250 is made of silicon oxide, silicon oxynitride, or another suitable material.

As shown in FIG. 2D, portions of the dielectric layers 210 and 250 are removed to form through holes 252, 254, and 256 in the dielectric layers 210 and 250, in accordance with some embodiments. The through holes 252, 254, and 256 respectively expose the gate structure G1 and the second type heavily doped regions 118 and 119, in accordance with some embodiments.

As shown in FIG. 2D, conductive structures 262, 264, and 266 are respectively formed in the through holes 252, 254, and 256, in accordance with some embodiments. The through holes 252, 254, and 256 are filled up with the conductive structures 262, 264, and 266, respectively, in accordance with some embodiments. The conductive structures 262, 264, and 266 are respectively electrically connected to the gate electrode layer 240 and the second type heavily doped regions 118 and 119, in accordance with some embodiments. The conductive structures 262, 264, and 266 are made of, for example, tungsten, copper, or other suitable conductive materials.

FIGS. 3A-3G are cross-sectional views of various stages of a process for forming a semiconductor device structure, in accordance with some embodiments. It should be noted that the embodiment of FIGS. 3A-3G is similar to the embodiment of FIGS. 1A-1I, except that the gate structure of the embodiment of FIGS. 3A-3G has two portions extending into the semiconductor substrate 110, in accordance with some embodiments. Therefore, the elements in FIGS. 3A-3G, which are named and/or labeled identically to those in FIGS. 1A-1I have materials and structures that are similar thereto. Therefore, detailed descriptions are not repeated herein.

Figure 3A:
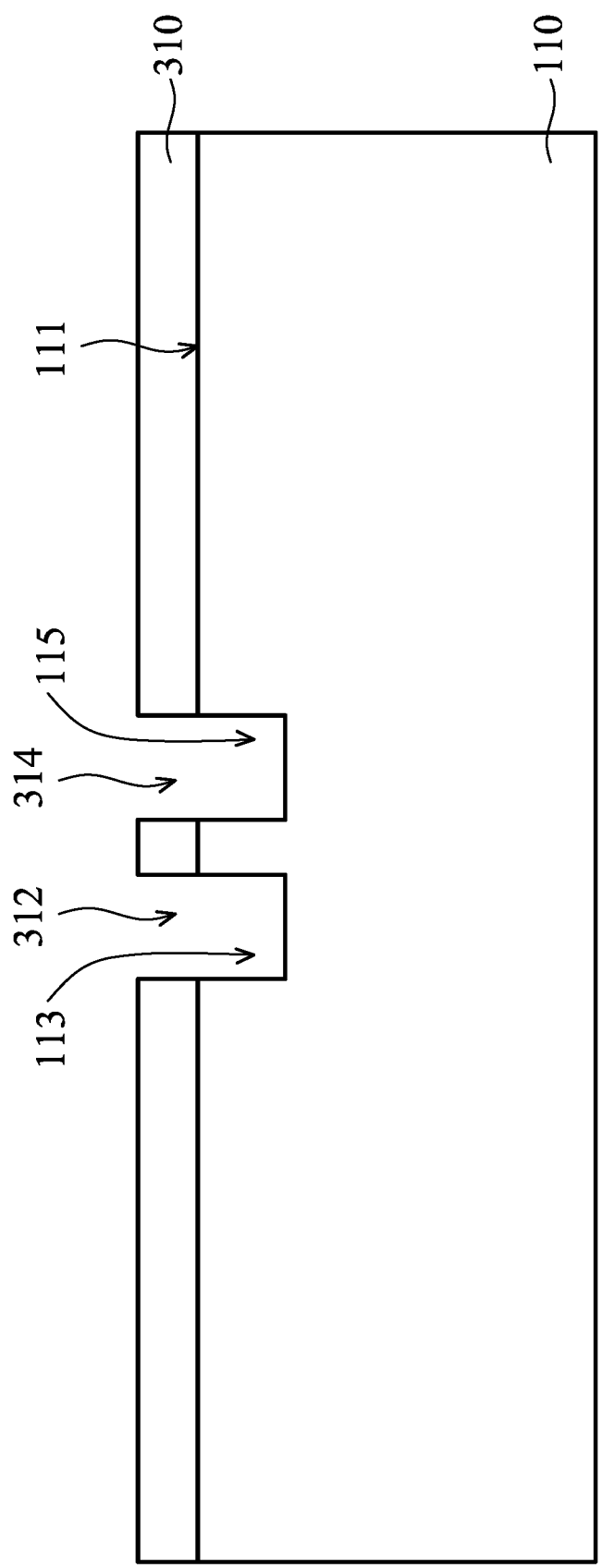
FIGS. 3A-3G are cross-sectional views of various stages of a process for forming a semiconductor device structure, in accordance with some embodiments.
Figure 3B:
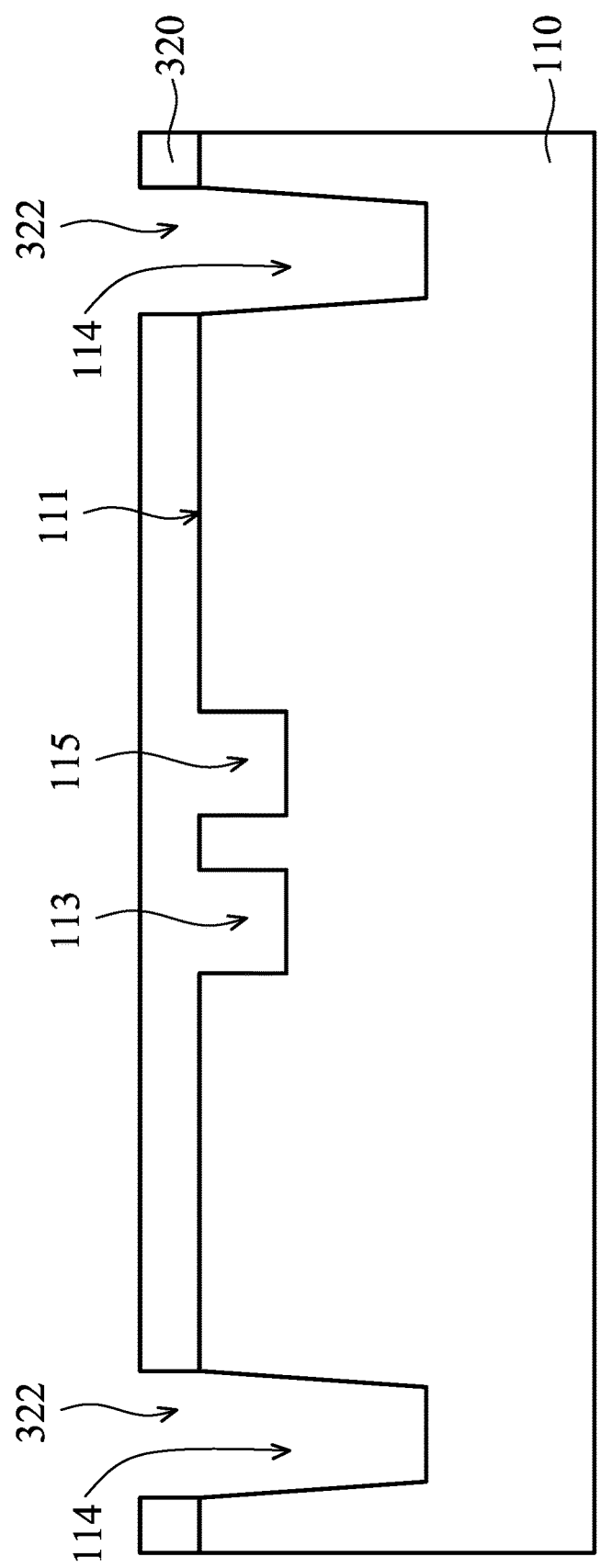

As shown in FIG. 3A, a semiconductor substrate 110 is provided. The semiconductor substrate 110 has a top surface 111, in accordance with some embodiments. As shown in FIG. 3A, a mask layer 310 is formed over the top surface 111, in accordance with some embodiments. The mask layer 310 has openings 312 and 314, in accordance with some embodiments. The openings 312 and 314 expose a portion of the semiconductor substrate 110, in accordance with some embodiments.

As shown in FIG. 3A, the portion of the semiconductor substrate 110 exposed by the openings 312 and 314 is removed to form trenches 113 and 115 in the semiconductor substrate 110, in accordance with some embodiments. The removal process is performed using an etching process, such as a dry etching process (e.g., a plasma etching process), in accordance with some embodiments.

As shown in FIG. 3A, a mask layer 320 is formed over the top surface 111, in accordance with some embodiments. The mask layer 320 has an opening 322, in accordance with some embodiments. The opening 322 exposes a portion of the semiconductor substrate 110, in accordance with some embodiments. As shown in FIG. 3A, the portion of the semiconductor substrate 110 exposed by the opening 322 is removed to form a trench 114 in the semiconductor substrate 110, in accordance with some embodiments.

Figure 3C:
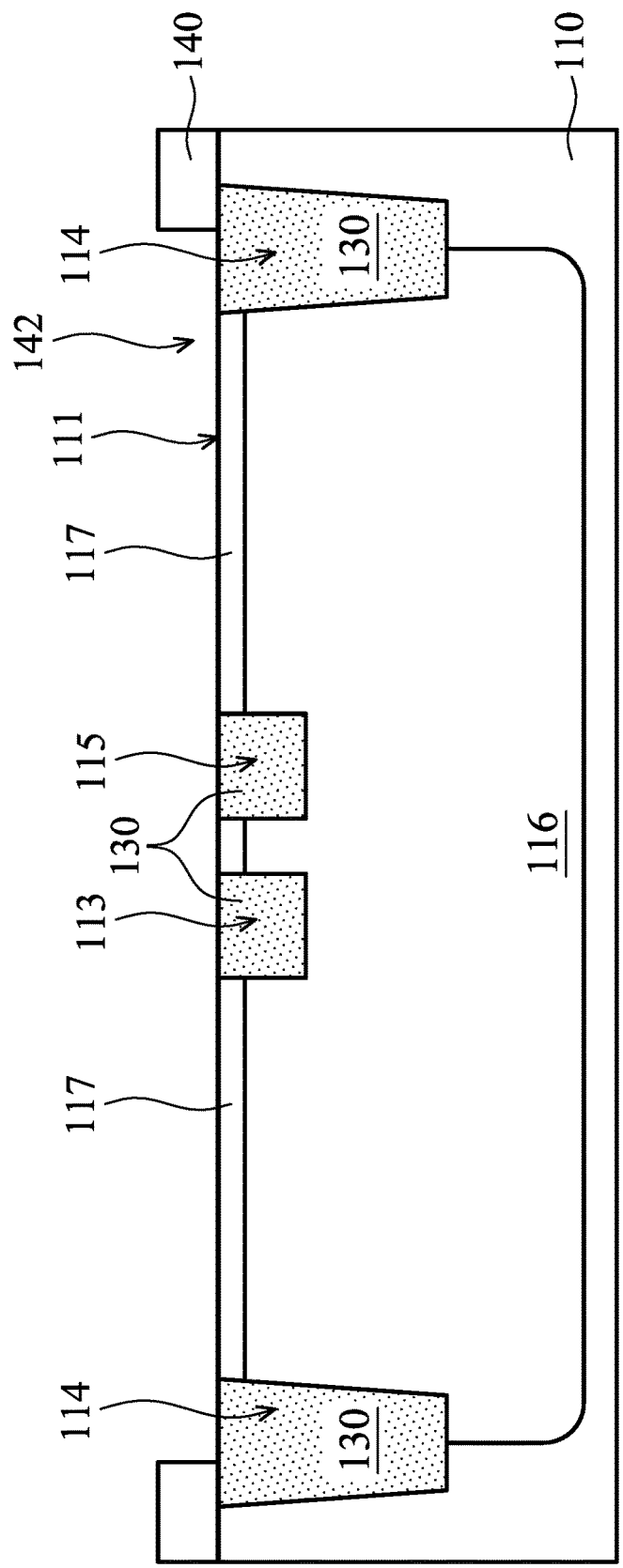

As shown in FIG. 3C, the mask layer 320 is removed, in accordance with some embodiments. As shown in FIG. 3C, an isolation structure 130 is formed in the trenches 113, 114, and 115, in accordance with some embodiments. The trenches 113, 114, and 115 are filled up with the isolation structure 130, in accordance with some embodiments.

As shown in FIG. 3C, a mask layer 140 is formed over the top surface 111, in accordance with some embodiments. The mask layer 140 has an opening 142, in accordance with some embodiments. The opening 142 exposes the semiconductor substrate 110 surrounded by the trench 114, in accordance with some embodiments.

As shown in FIG. 3C, an ion implantation process is performed to implant first type dopants into the semiconductor substrate 110 to form a first type well 116, in accordance with some embodiments. The first type well 116 is formed in the semiconductor substrate 110 surrounded by the trench 114, in accordance with some embodiments. The first type dopants and the first type well 116 have a first type conductivity, in accordance with some embodiments. The first type conductivity may be a P-type conductivity or an N-type conductivity.

As shown in FIG. 3C, an ion implantation process is performed to implant second type dopants into the semiconductor substrate 110 surrounded by the trench 114 to form second type lightly doped regions 117, in accordance with some embodiments.

The second type dopants and the second type lightly doped regions 117 have a second type conductivity, in accordance with some embodiments. The second type conductivity may be an N-type conductivity or a P-type conductivity. The second type conductivity is different from the first type conductivity, in accordance with some embodiments.

Figure 3D:
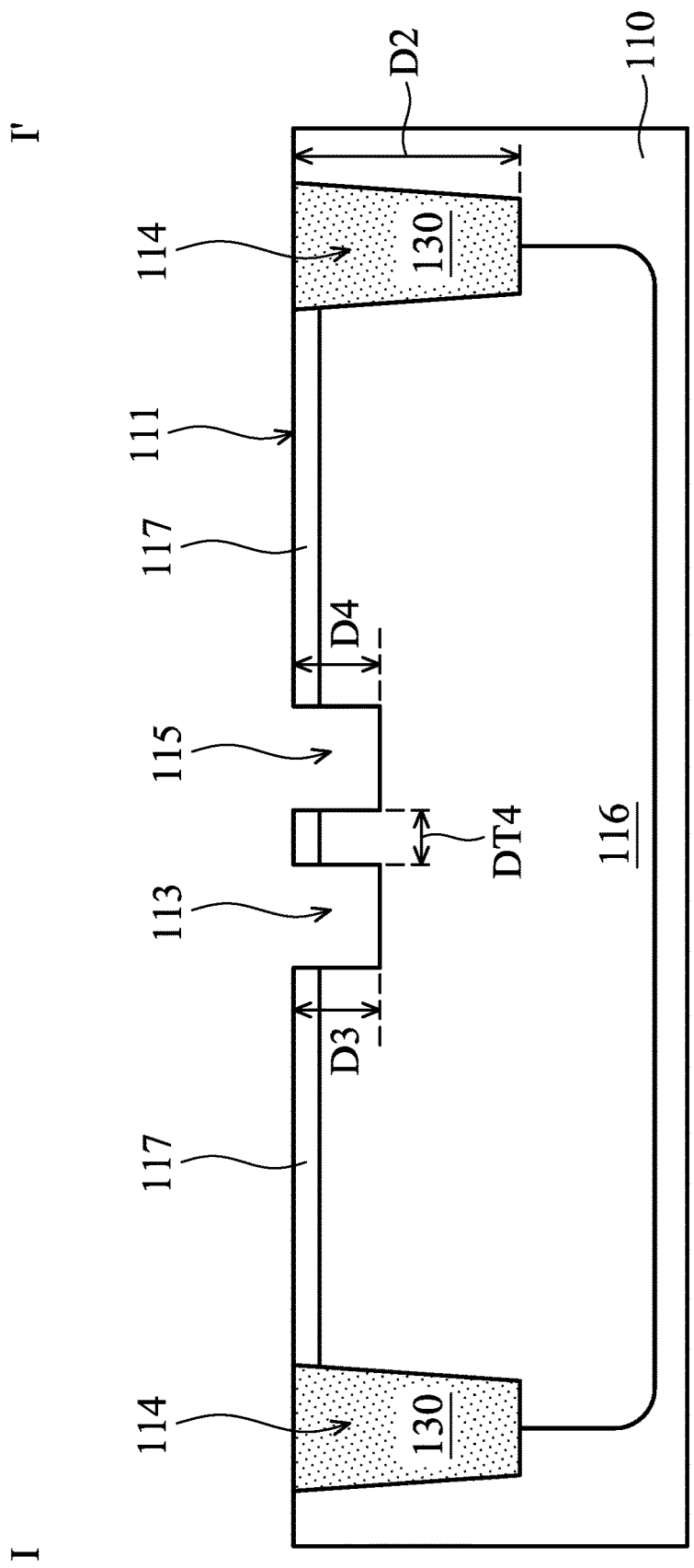
Figures 1, 3D:
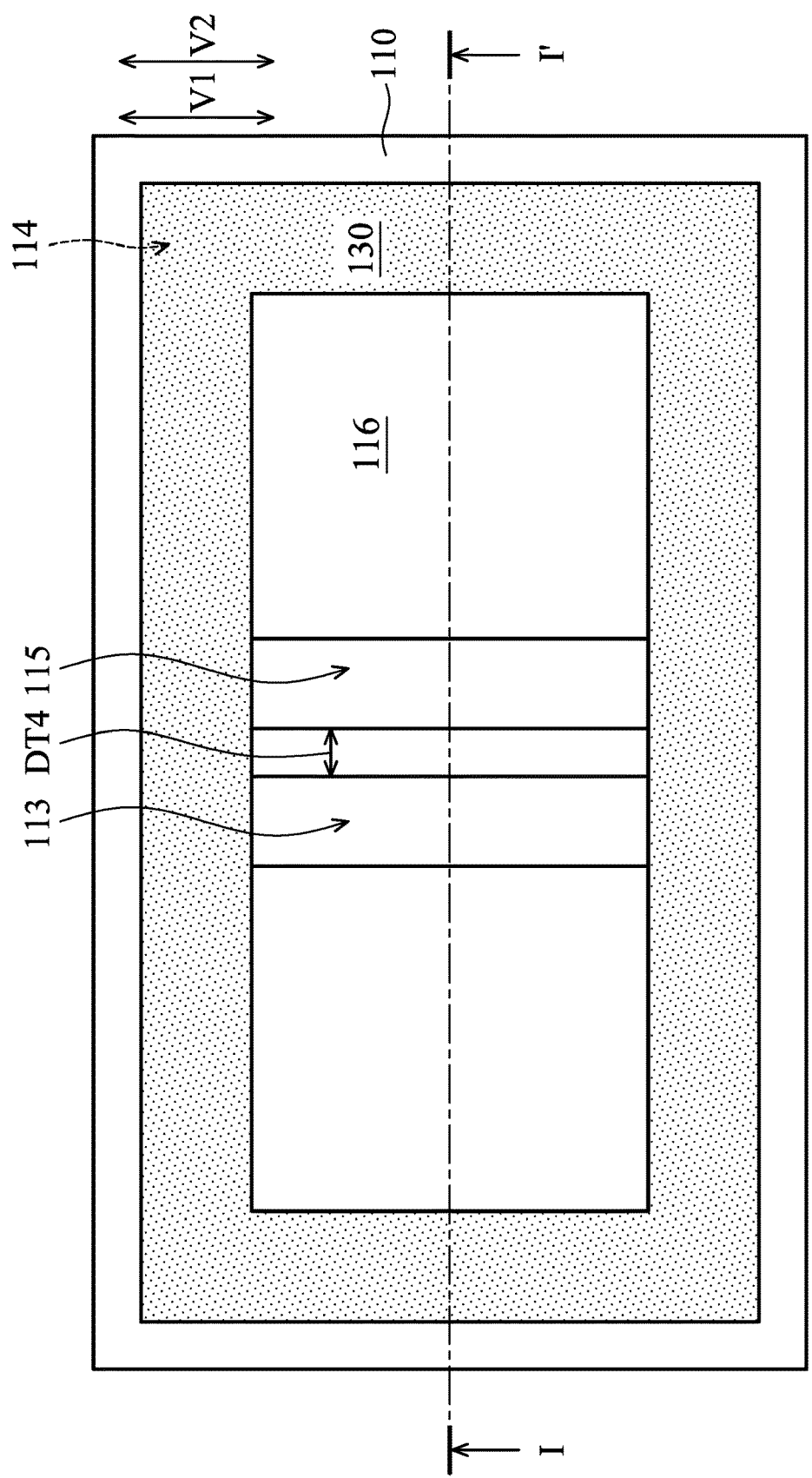

FIG. 3D-1 is a top view of the semiconductor device structure of FIG. 3D, in accordance with some embodiments. FIG. 3D is a cross-sectional view illustrating the semiconductor device structure along a sectional line I-I' in FIG. 3D-1, in accordance with some embodiments.

As shown in FIG. 3D, the mask layer 140 is removed, in accordance with some embodiments. As shown in FIG. 3D, the isolation structure 130 in the trenches 113 and 115 is removed, in accordance with some embodiments. As shown in FIGS. 3D and 3D-1, the trench 114 and the isolation structure 130 surround the trenches 113 and 115, in accordance with some embodiments. The trench 114 communicates with the trenches 113 and 115, in accordance with some embodiments.

In some embodiments, a depth D3 of the trench 113 is substantially equal to a depth D4 of the trench 115. The term "substantially equal to" means a ratio of the difference between the depths D3 and D4 to the depth D3 or D4 ranges from about −5% to about 5%, in accordance with some embodiments.

The depth D3 or D4 ranges from about 0.05 µm to about 0.15 µm, in accordance with some embodiments. The depth D2 of the trench 114 is greater than the depth D3 or D4, in accordance with some embodiments.

Figure 3E:
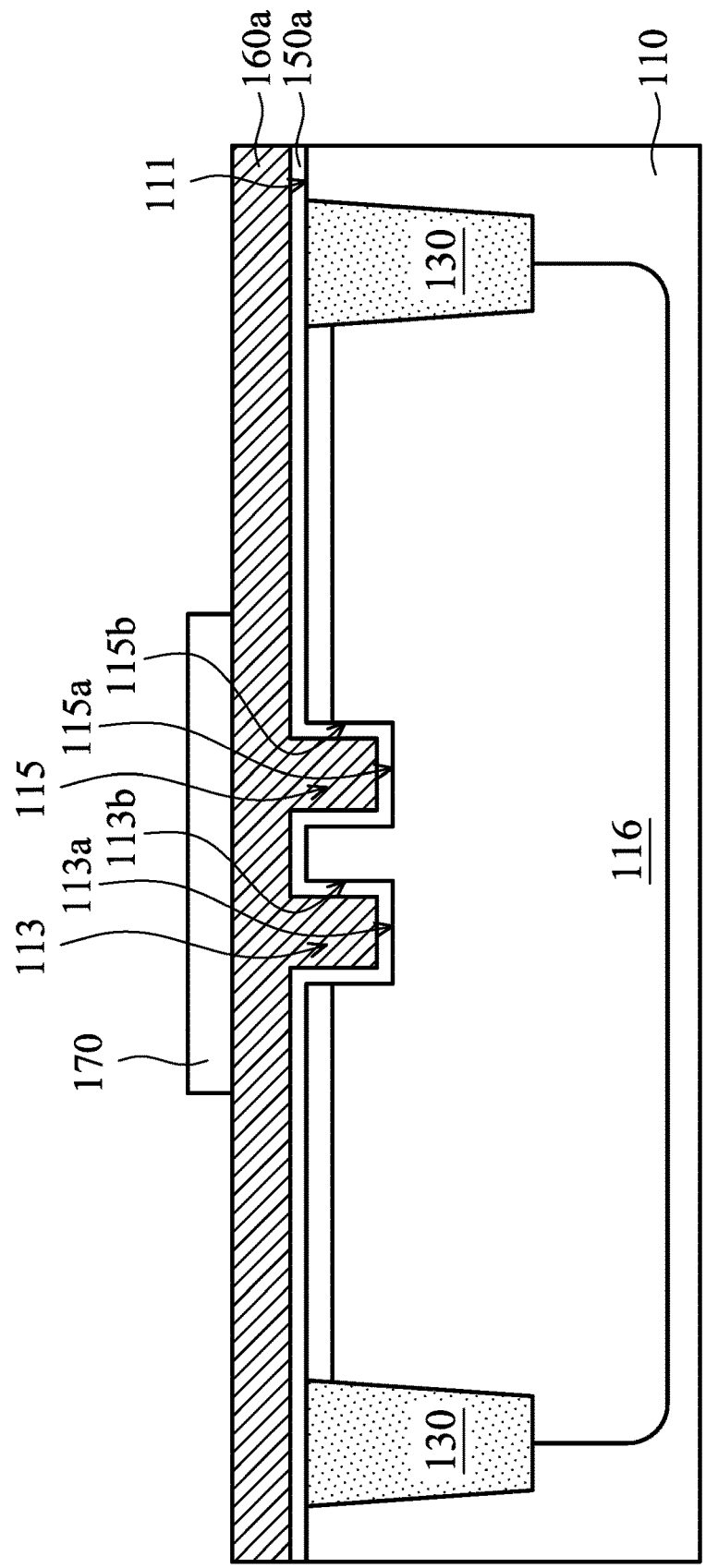

As shown in FIG. 3E, a gate dielectric material layer 150a is conformally deposited over the top surface 111, bottom surfaces 113c and 115a and inner walls 113d and 115b of the trenches 113 and 115, in accordance with some embodiments.

As shown in FIG. 3E, a gate dielectric material layer 150a is conformally deposited over the top surface 111, bottom surfaces 113a and 115a and inner walls 113b and 115b of the trenches 113 and 115, in accordance with some embodiments.

As shown in FIG. 3E, a gate material layer 160a is deposited over the gate dielectric material layer 150a, in accordance with some embodiments. As shown in FIG. 3E, a mask layer 170 is formed over the gate material layer 160a, in accordance with some embodiments. The mask layer 170 exposes a portion of the gate material layer 160a, in accordance with some embodiments.

Figure 3F:
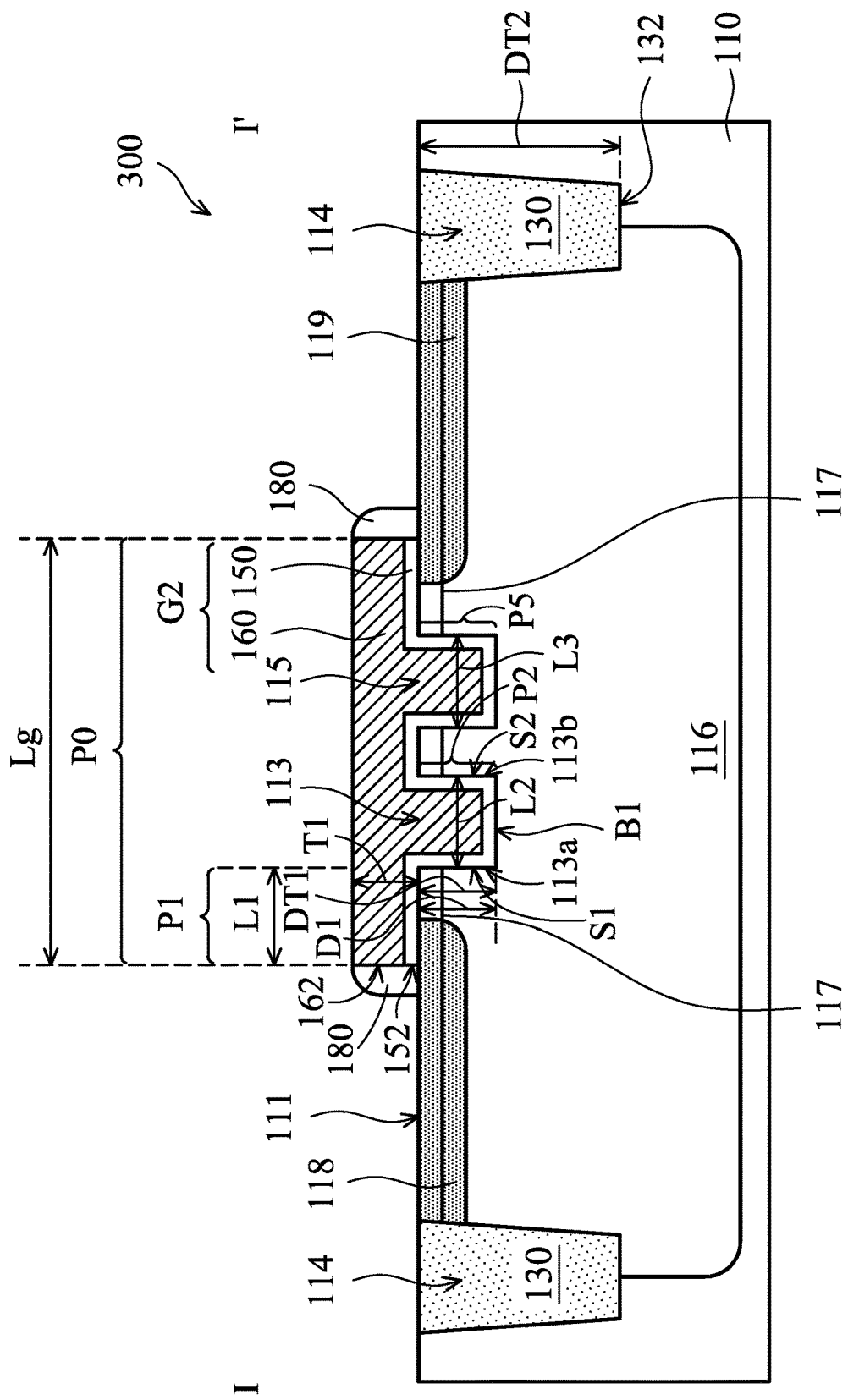
Figures 1, 3F:
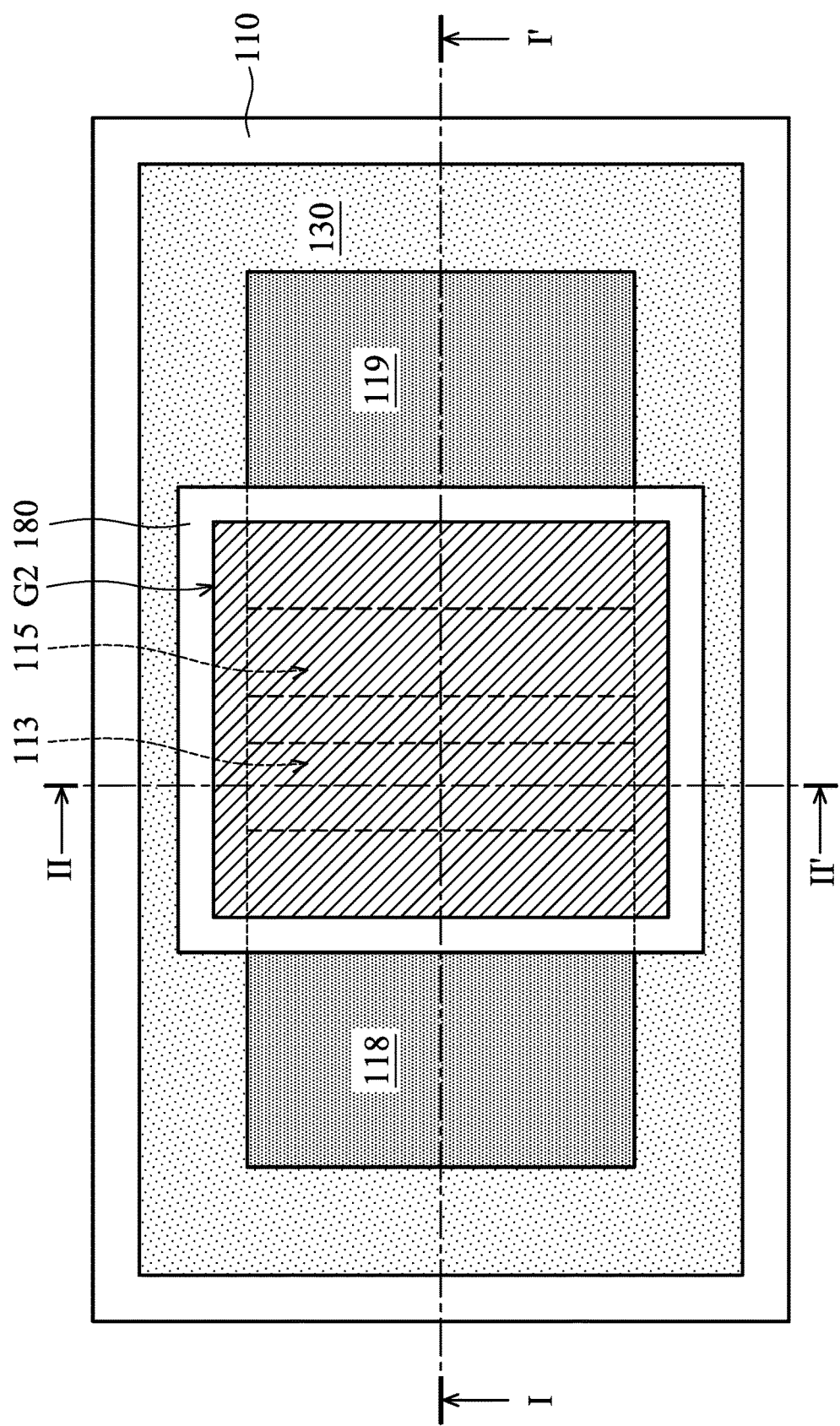
Figures 2, 3F:
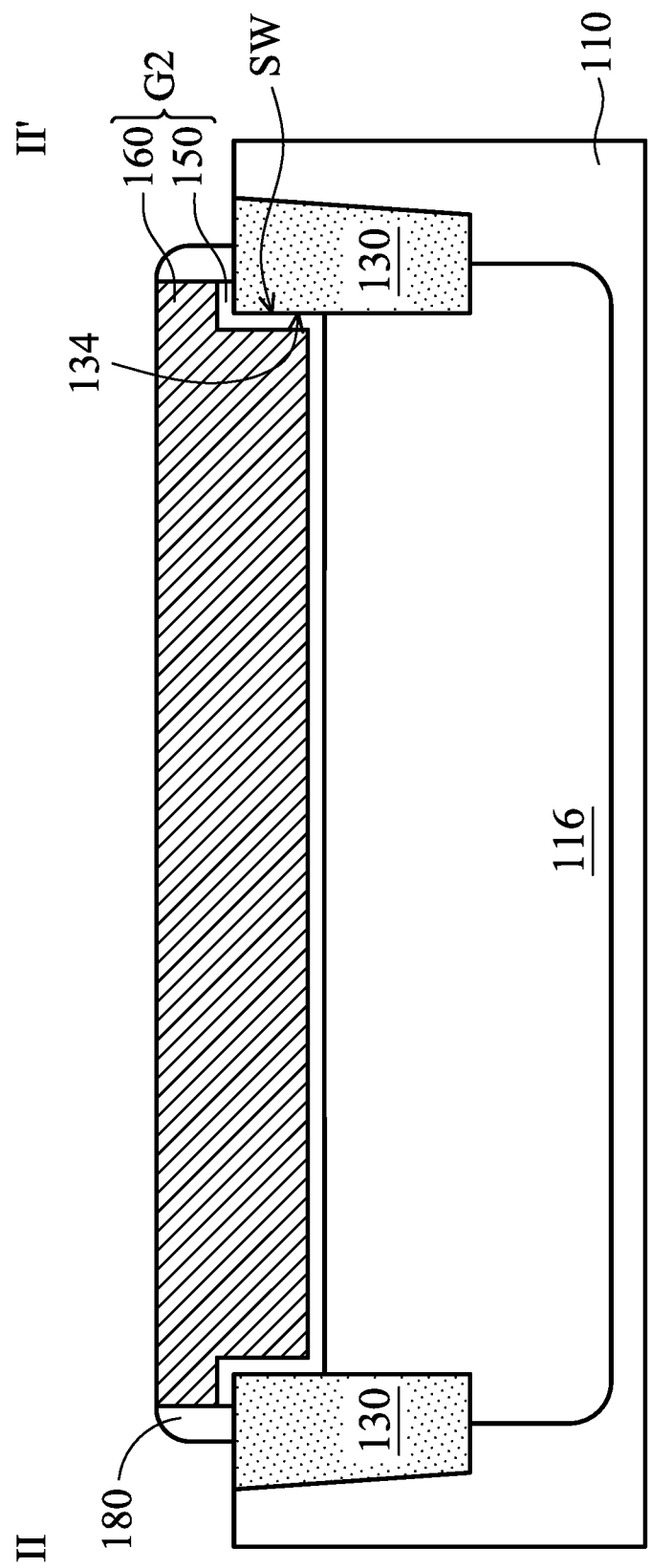

As shown in FIG. 3F, the gate material layer 160a exposed by the mask layer 170 is removed, and the gate dielectric material layer 150a under the removed gate material layer 160a is also removed, in accordance with some embodiments. The gate material layer 160a and the gate dielectric material layer 150a remaining under the mask layer 170 form a gate electrode 160 and a gate dielectric layer 150, in accordance with some embodiments. The gate electrode 160 and the gate dielectric layer 150 together form a gate structure G2, in accordance with some embodiments.

FIG. 3F-1 is a top view of the semiconductor device structure of FIG. 3F, in accordance with some embodiments. FIG. 3F is a cross-sectional view illustrating the semiconductor device structure along a sectional line I-I' in FIG. 3F-1, in accordance with some embodiments. FIG. 3F-2 is a cross-sectional view illustrating the semiconductor device structure along a sectional line II-II' in FIG. 3F-1, in accordance with some embodiments.

As shown in FIG. 3F, the mask layer 170 is removed, in accordance with some embodiments. As shown in FIG. 3F, a spacer layer 180 is formed over sidewalls 162 and 152 of the gate electrode 160 and the gate dielectric layer 150, in accordance with some embodiments. As shown in FIGS. 3F and 3F-1, the spacer layer 180 only surrounds the gate structure G2 over the top surface 111 and does not surround the gate structure G2 in the semiconductor substrate 110, in accordance with some embodiments.

As shown in FIGS. 3F and 3F-1, second type heavily doped regions 118 and 119 are formed in the semiconductor substrate 110 by using a suitable process, such as an ion implantation process. The second type heavily doped regions 118 and 119 are a source region and a drain region, respectively, in accordance with some embodiments. The second type heavily doped regions 118 and 119 are located at the two opposite sides of the gate structure G2.

The trenches 113 and 115 and the gate structure G2 are between the second type heavily doped regions 118 and 119, in accordance with some embodiments. The trenches 113 and 115 and the gate structure G2 separate the second type heavily doped region 118 from the second type heavily doped region 119, in accordance with some embodiments.

The second type heavily doped regions 118 and 119 are doped with second type dopants, in accordance with some embodiments. The second type dopants and the second type heavily doped regions 118 and 119 have a second type conductivity, in accordance with some embodiments. The second type conductivity is different from the first type conductivity, in accordance with some embodiments. The second type conductivity may be an N-type conductivity or a P-type conductivity, in accordance with some embodiments.

The gate structure G2, the spacer layer 180, the first type well 116, the second type lightly doped regions 117, and the second type heavily doped regions 118 and 119 together constitute a transistor device 300, in accordance with some embodiments.

As shown in FIGS. 3F, 3F-1, and 3F-2, the gate structure G2 is formed in the trenches 113 and 115 and extends to the top surface 111, in accordance with some embodiments. The trench 113 has opposite sides 113a and 113b, in accordance with some embodiments. The opposite sides 113a and 113b respectively face the second type heavily doped regions 118 and 119, in accordance with some embodiments. The gate structure G2 in the trench 113 has opposite sides S1 and S2, in accordance with some embodiments. The opposite sides S1 and S2 respectively face the second type heavily doped regions 118 and 119, in accordance with some embodiments.

In some embodiments, a portion P1 of the gate structure G2 over the top surface 111 and on the side 113a or S1 has a length L1. The depth D1 of the trench 113 or 115 is greater than the length L1, in accordance with some embodiments. In some embodiments, a portion P2 of the gate structure G2 in the trench 113 has a bottom surface B1. In some embodiments, a distance DT1 between the bottom surface B1 and the top surface 111 is greater than the length L1. In some embodiments, a distance DT2 between a bottom surface 132 of the isolation structure 130 and the top surface 111 is greater than the distance DT1.

In some embodiments, a portion P0 of the gate structure G2 over the top surface 111 has a length Lg, a portion P2 of the gate structure G2 in the trench 113 has a length L2, a portion P5 of the gate structure G2 in the trench 115 has a length L3, and the length Lg is greater than a sum of the lengths L2 and L3.

As shown in FIGS. 3F-1 and 3F-2, the gate structure G2 is partially over the isolation structure 130, in accordance with some embodiments. As shown in FIGS. 3F, 3F-1, and 3F-2, the isolation structure 130 surrounds the gate structure G2 in the trenches 113 and 115, in accordance with some embodiments. As shown in FIGS. 3F-1 and 3F-2, the isolation structure 130 is in direct contact with the gate structure G2 (or the gate dielectric layer 150), in accordance with some embodiments.

The gate structure G2 has a sidewall SW, in accordance with some embodiments. The isolation structure 130 has a sidewall 134, in accordance with some embodiments. The sidewalls SW and 134 face to each other, in accordance with some embodiments. The sidewalls SW and 134 are in direct contact with each other, in accordance with some embodiments. As shown in FIG. 3F, the depth D1 of the trench 113 is greater than the thickness T1 of the gate structure G2 over the top surface 111, in accordance with some embodiments.

Figure 3G:
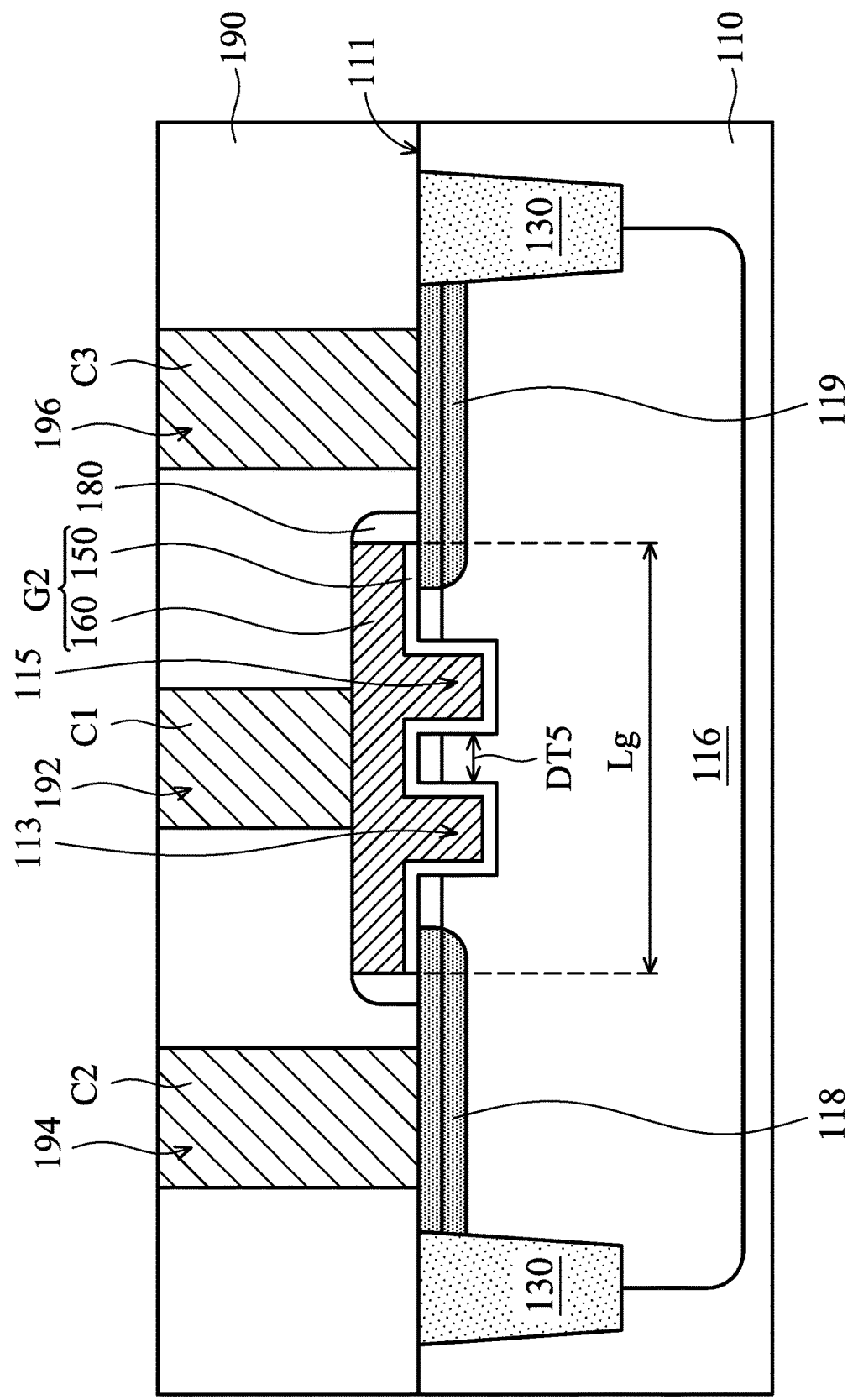

As shown in FIG. 3G, a dielectric layer 190 is formed over the semiconductor substrate 110, the gate structure G2, and the spacer layer 180, in accordance with some embodiments. As shown in FIG. 3G, portions of the dielectric layer 190 are removed to form through holes 192, 194, and 196 in the dielectric layer 190, in accordance with some embodiments. The through holes 192, 194, and 196 respectively expose the gate structure G2 and the second type heavily doped regions 118 and 119, in accordance with some embodiments.

As shown in FIG. 3G, conductive structures C1, C2, and C3 are respectively formed in the through holes 192, 194, and 196, in accordance with some embodiments. The conductive structures C1, C2, and C3 are respectively electrically connected to the gate electrode 160 and the second type heavily doped regions 118 and 119, in accordance with some embodiments.

The distance DT5 between the gate structure G2 in the trench 113 and the gate structure G2 in the trench 115 is adjustable, and therefore the gate length Lg is adjustable as well, in accordance with some embodiments.

Figure 4A:
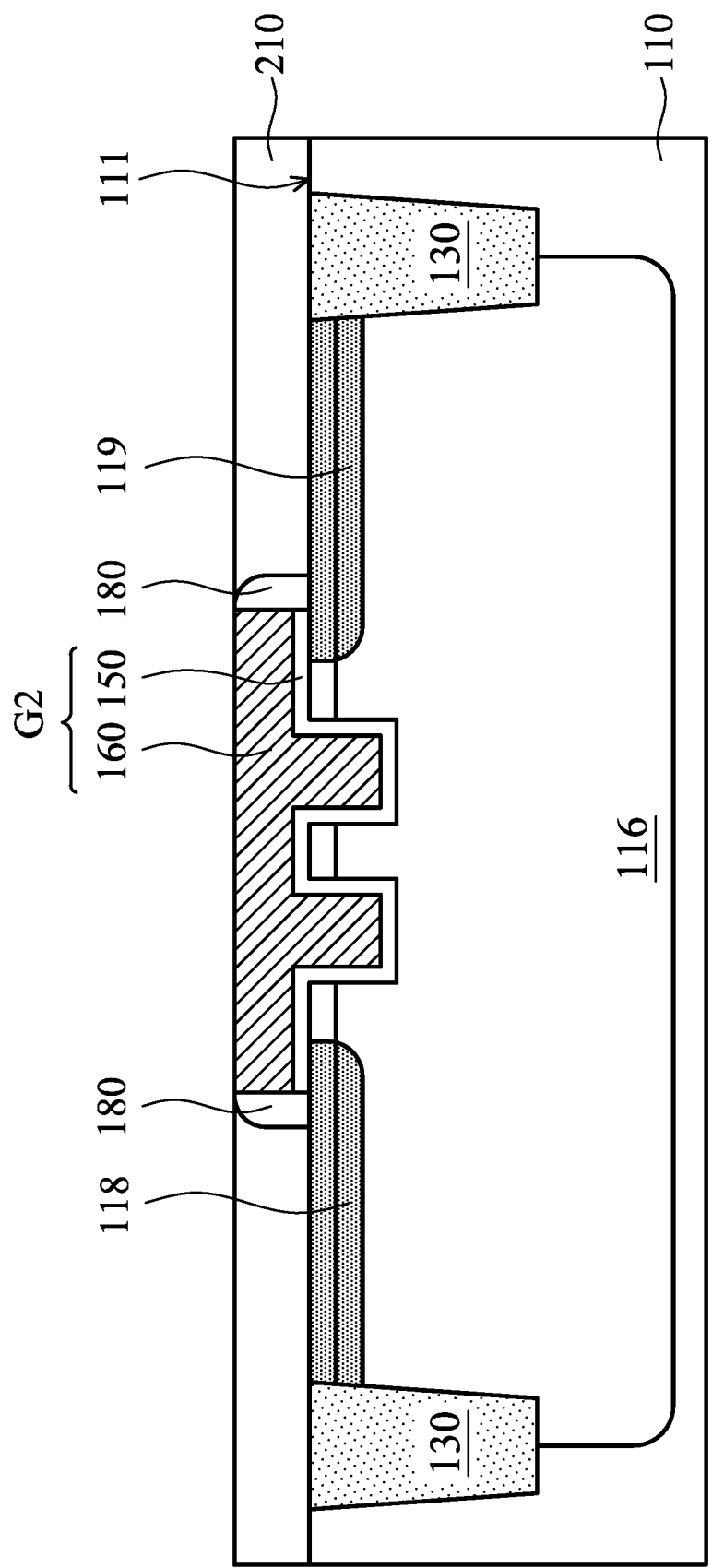
FIGS. 4A-4D are cross-sectional views of various stages of a process for forming a semiconductor device structure, in accordance with some embodiments.

FIGS. 4A-4D are cross-sectional views of various stages of a process for forming a semiconductor device structure, in accordance with some embodiments. As shown in FIG. 4A, after the step of FIG. 3F, a dielectric layer 210 is formed over the top surface 111 and surrounds the gate structure G2, in accordance with some embodiments.

Figure 4B:
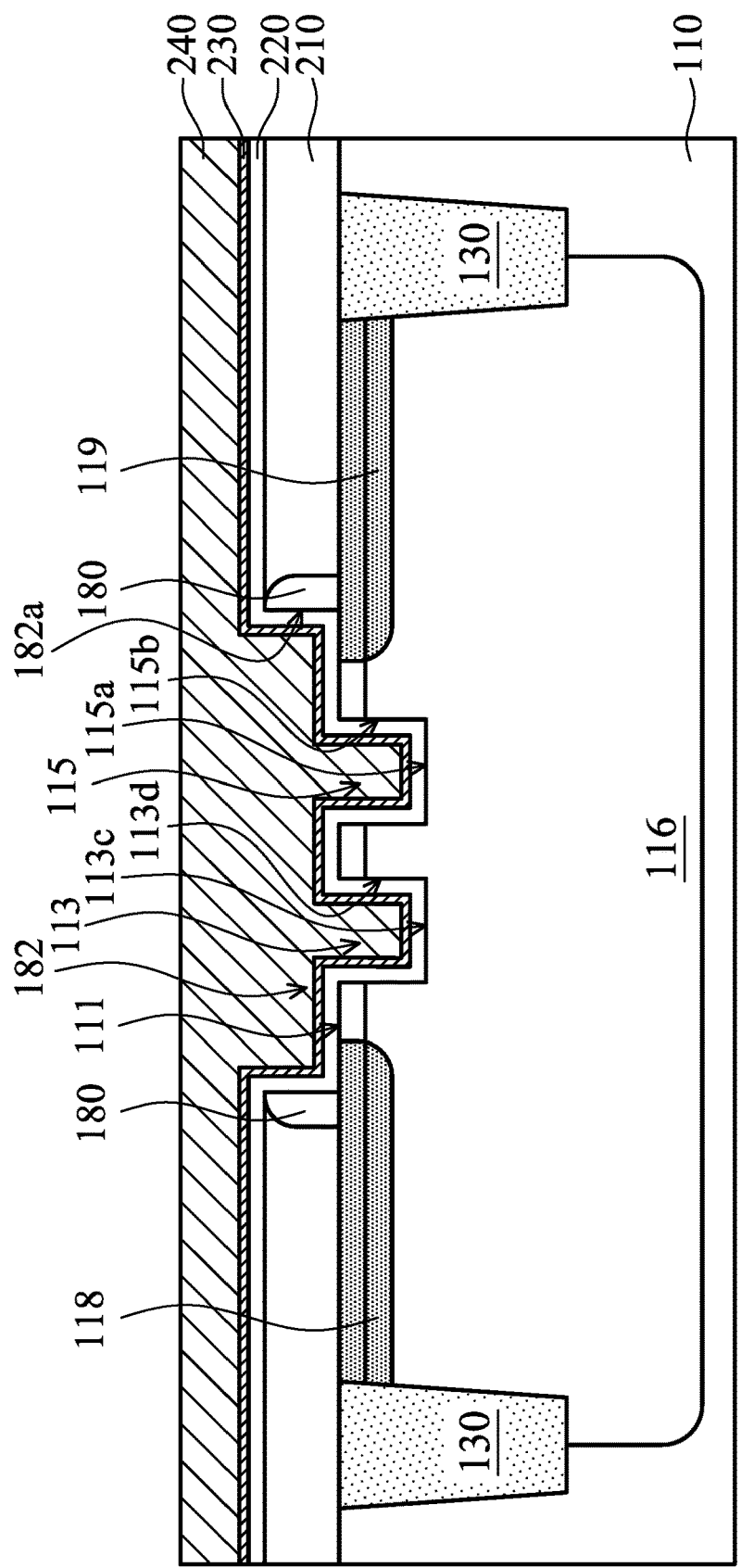

As shown in FIG. 4B, the gate structure G2 is removed to form an opening 182 in the spacer layer 180, in accordance with some embodiments. As shown in FIG. 4B, a gate dielectric layer 220 is deposited over the dielectric layer 210 and the spacer layer 180 and in the opening 182 and the trenches 113 and 115, in accordance with some embodiments.

The gate dielectric layer 220 conformally covers the inner walls 182a of the opening 182, the top surface 111 exposed by the opening 182, and the bottom surface 113c and 115a and the inner walls 113d and 115b of the trenches 113 and 115, in accordance with some embodiments.

As shown in FIG. 4B, a work function metal layer 230 is deposited over the gate dielectric layer 220, in accordance with some embodiments. As shown in FIG. 4B, a gate electrode layer 240 (also called a metal gate electrode layer) is deposited over the work function metal layer 230 to fill the opening 182 and the trenches 113 and 115, in accordance with some embodiments. The gate electrode layer 240 includes a suitable metal material, such as aluminum, tungsten, gold, platinum, cobalt, another suitable metal, an alloy thereof, or a combination thereof, in accordance with some embodiments.

Figure 4C:
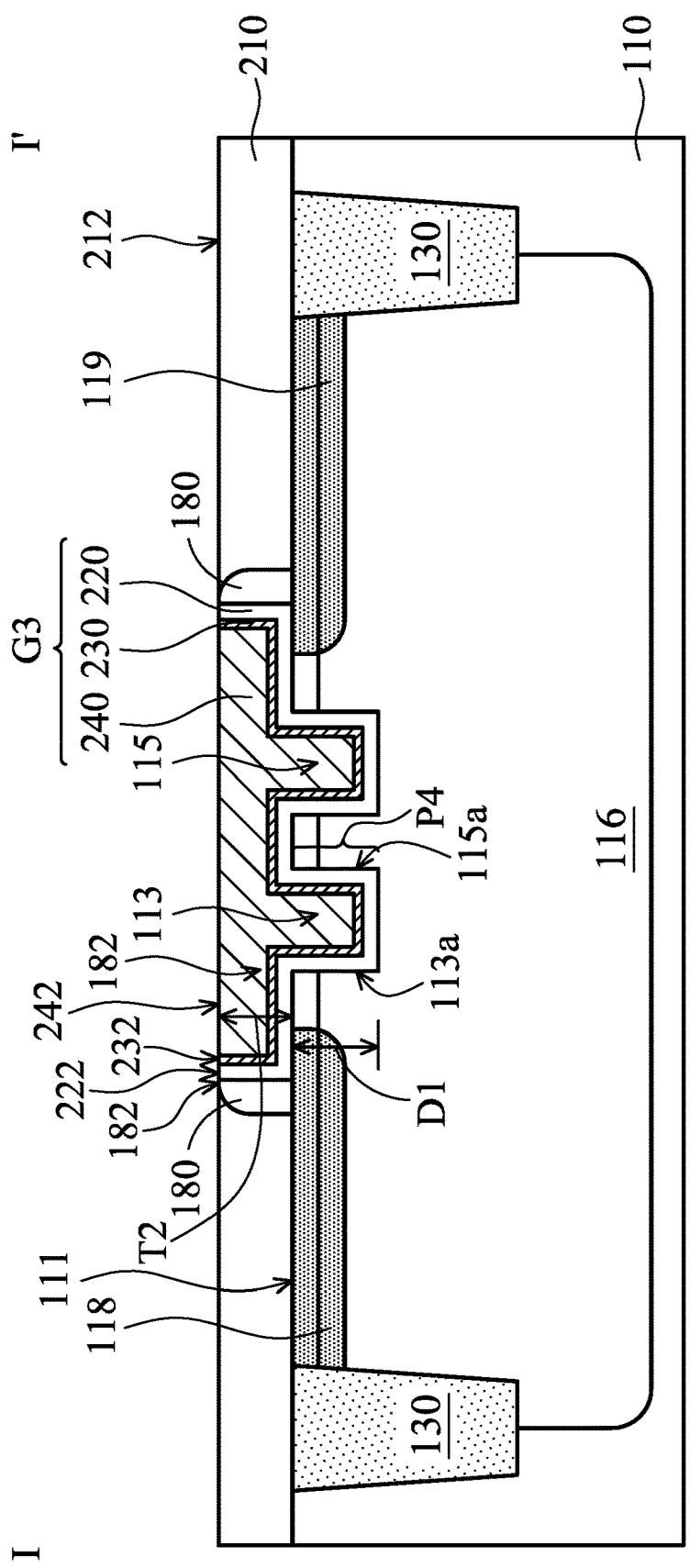
Figures 1, 4C:
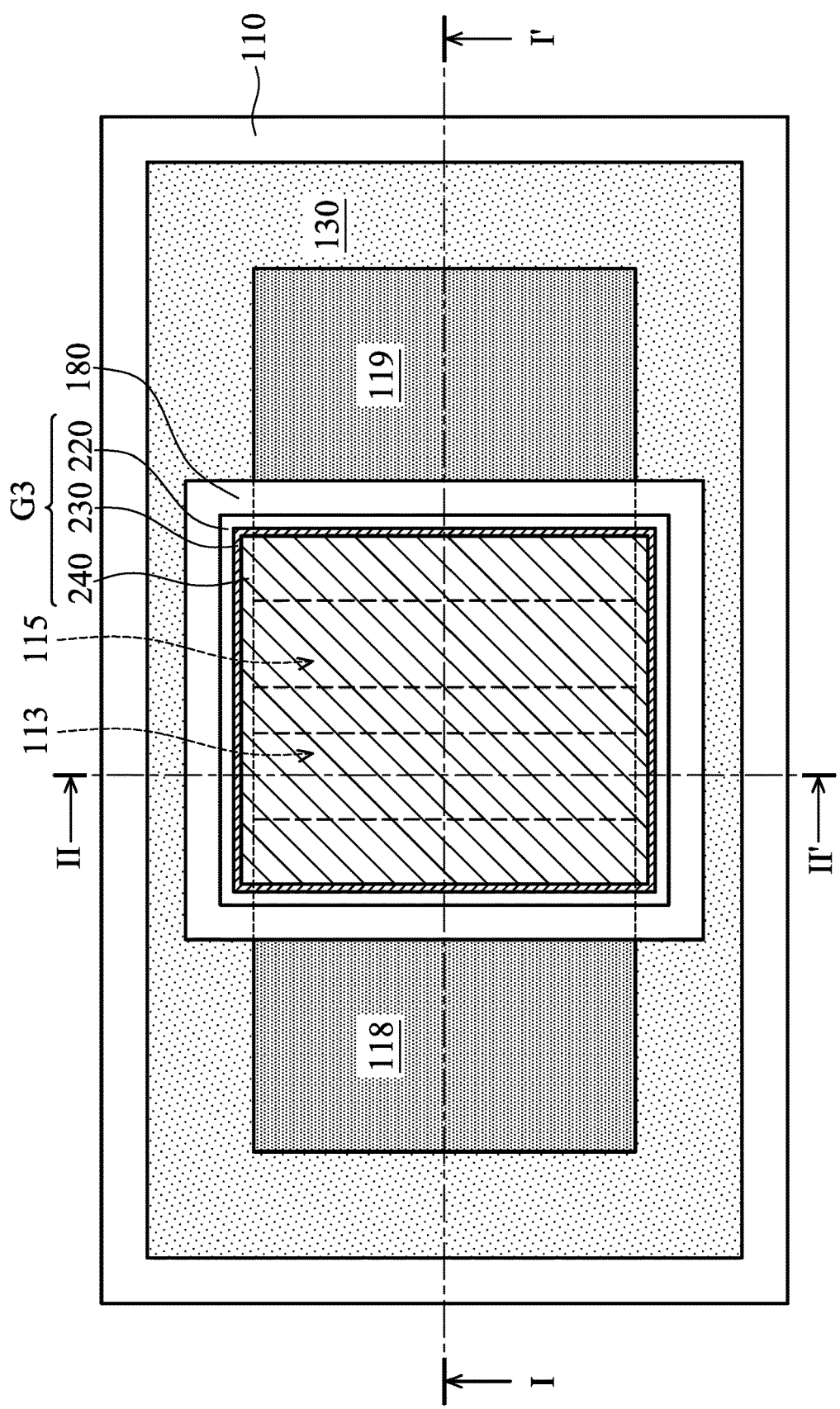
Figures 2, 4C:
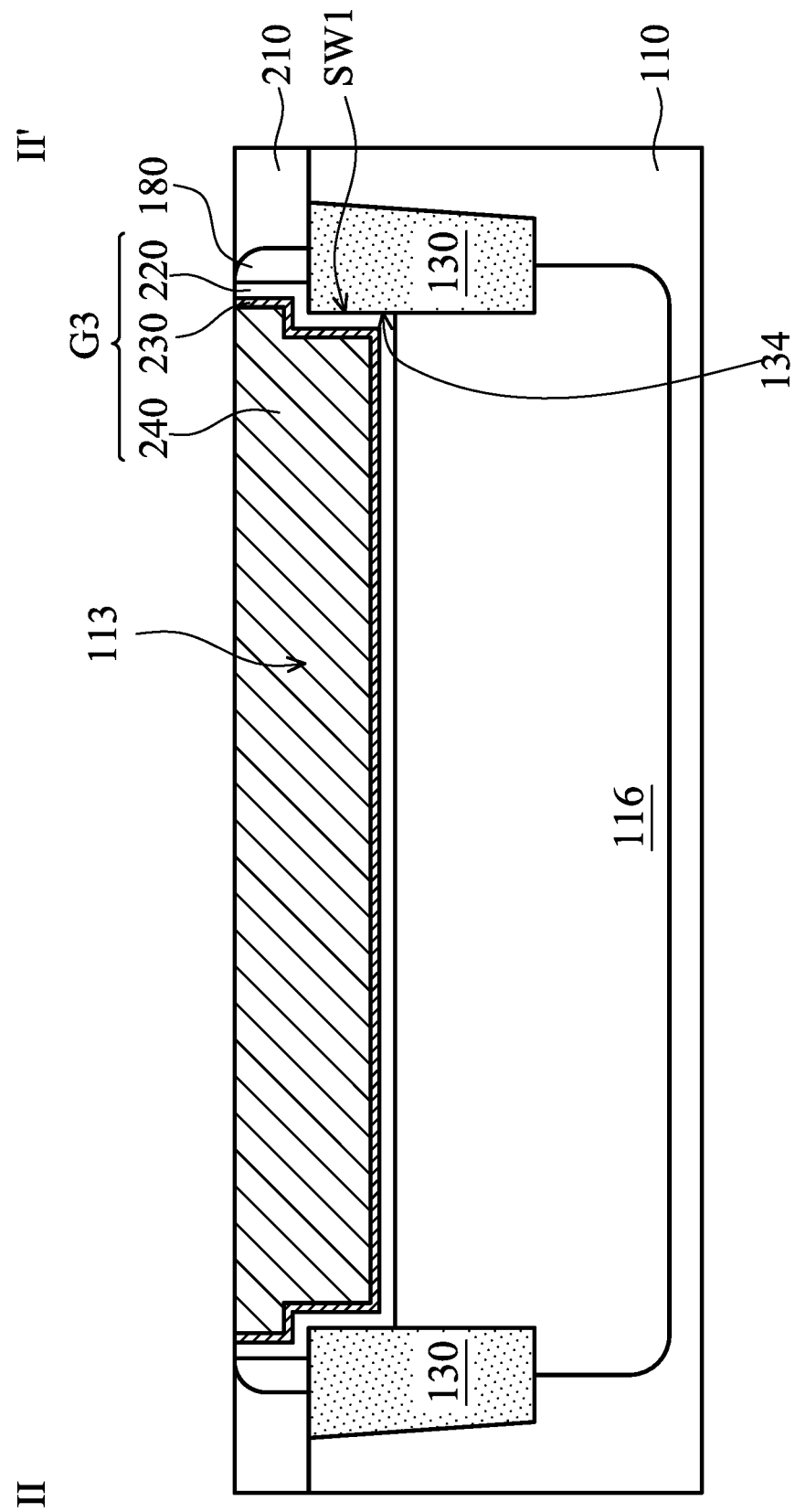

FIG. 4C-1 is a top view of the semiconductor device structure of FIG. 4C, in accordance with some embodiments. For the sake of simplicity, FIG. 4C-1 does not show the dielectric layer 210, in accordance with some embodiments. FIG. 4C is a cross-sectional view illustrating the semiconductor device structure along a sectional line I-I' in FIG. 4C-1, in accordance with some embodiments. FIG. 4C-2 is a cross-sectional view illustrating the semiconductor device structure along a sectional line II-II' in FIG. 4C-1, in accordance with some embodiments.

As shown in FIGS. 4C, 4C-1, and 4C-2, a planarization process is performed to remove the gate electrode layer 240, the work function metal layer 230, and the gate dielectric layer 220 outside of the opening 182 and the trenches 113 and 115, in accordance with some embodiments. In some embodiments, top surfaces 242, 232, 222, 183, and 212 of the gate electrode layer 240, the work function metal layer 230, the gate dielectric layer 220, the spacer layer 180, and the dielectric layer 210 are coplanar, in accordance with some embodiments.

The gate electrode layer 240, the work function metal layer 230, and the gate dielectric layer 220 in the opening 182 and the trenches 113 and 115 together form a gate structure G3 (i.e., a metal gate stack), in accordance with some embodiments.

The gate structure G3 is partially over the isolation structure 130, in accordance with some embodiments. The isolation structure 130 surrounds the gate structure G3 in the trenches 113 and 115, in accordance with some embodiments. The isolation structure 130 is in direct contact with the gate structure G3 (or the gate dielectric layer 220), in accordance with some embodiments. As shown in FIG. 4C, the depth D1 of the trench 113 is greater than the thickness T2 of the gate structure G3 over the top surface 111, in accordance with some embodiments.

Figure 4D:
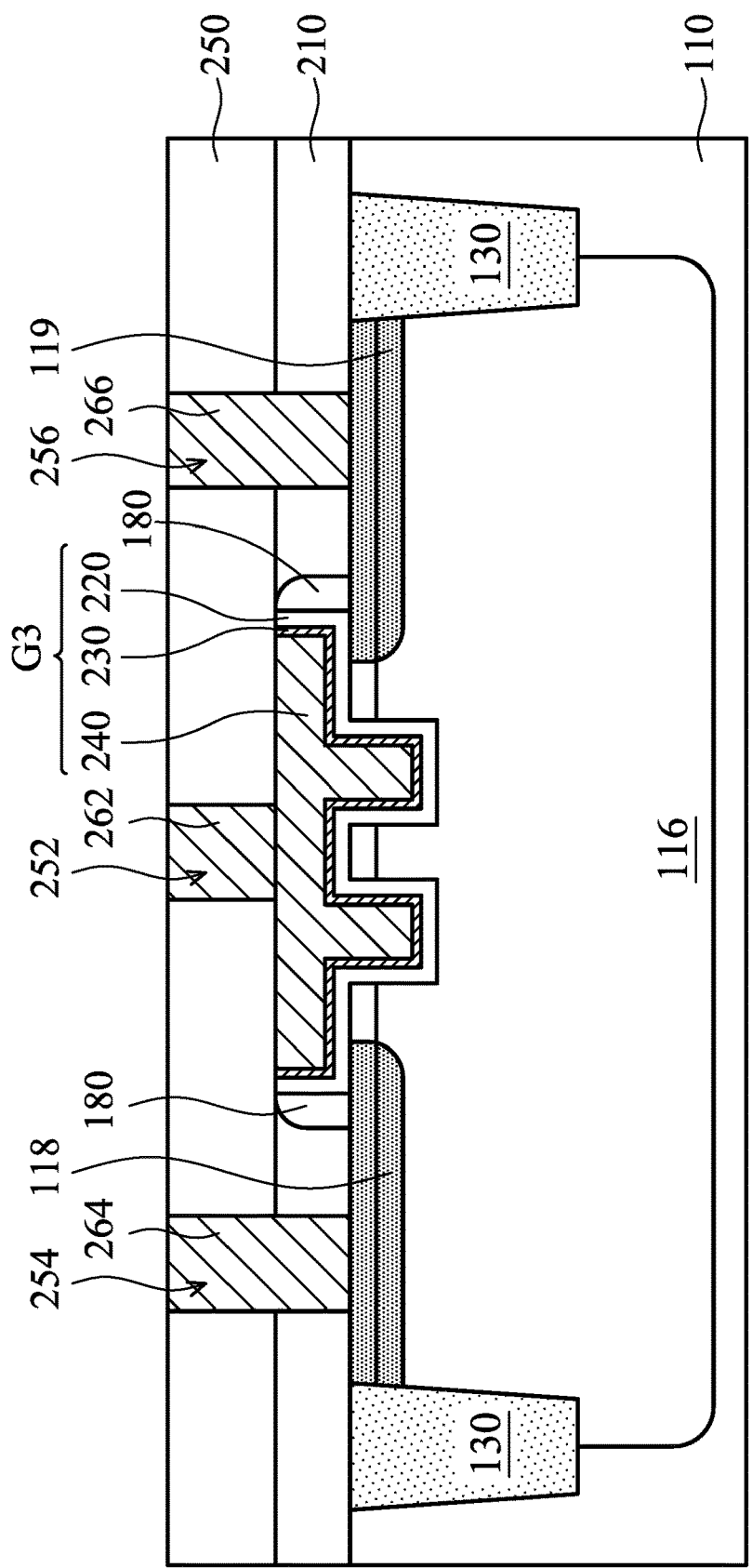

As shown in FIG. 4D, a dielectric layer 250 is formed over the gate structure G3, the dielectric layer 210, and the spacer layer 180, in accordance with some embodiments. As shown in FIG. 4D, portions of the dielectric layers 210 and 250 are removed to form through holes 252, 254, and 256 in the dielectric layers 210 and 250, in accordance with some embodiments. The through holes 252, 254, and 256 respectively expose the gate structure G3 and the second type heavily doped regions 118 and 119.

As shown in FIG. 4D, conductive structures 262, 264, and 266 may be respectively formed in the through holes 252, 254, and 256. The conductive structures 262, 264, and 266 are respectively electrically connected to the gate electrode layer 240 and the second type heavily doped regions 118 and 119.

Figure 5:
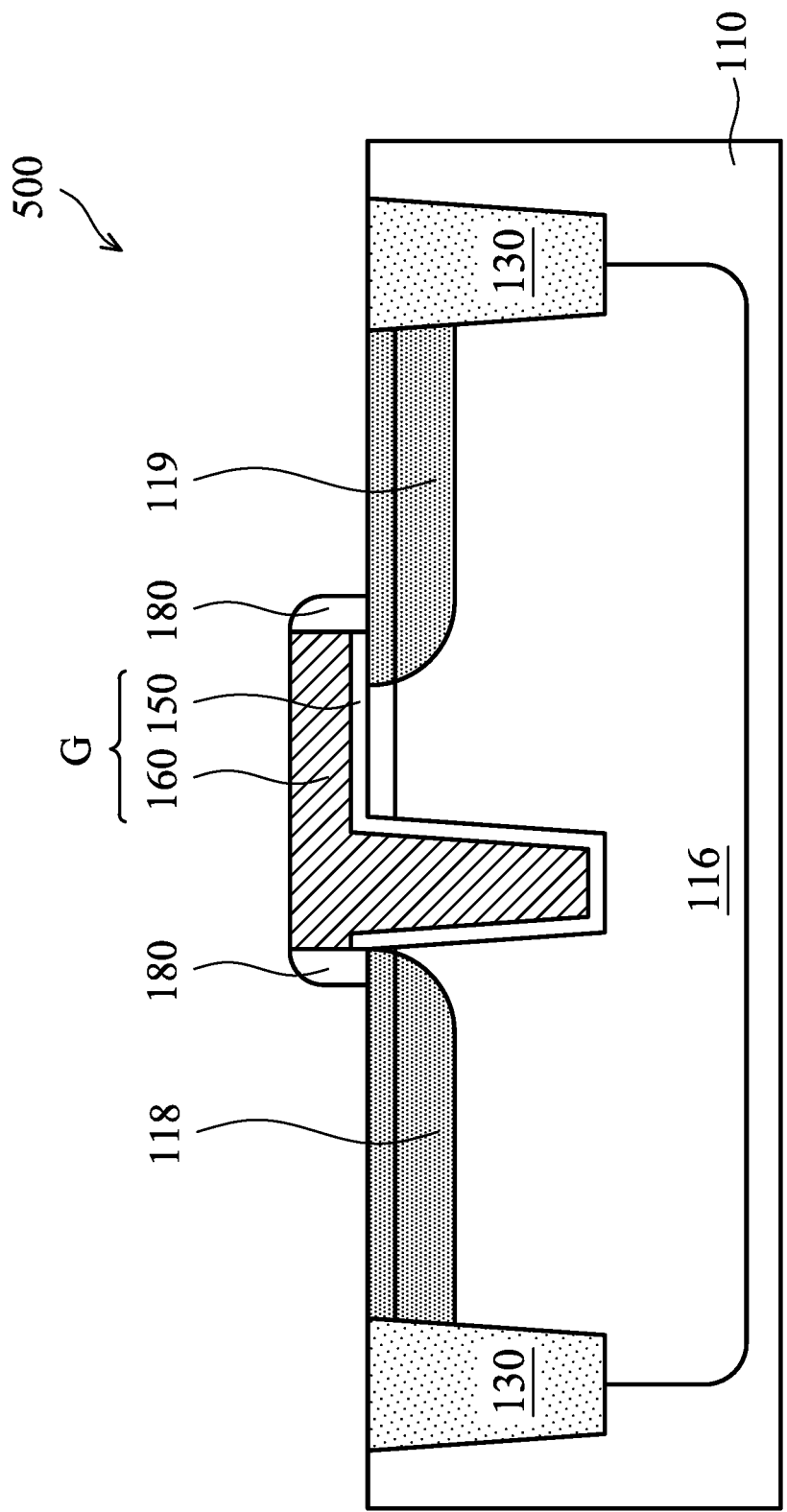
FIG. 5 is a cross-sectional view of a semiconductor device structure, in accordance with some embodiments.

FIG. 5 is a cross-sectional view of a semiconductor device structure 500, in accordance with some embodiments. As shown in FIG. 5, the semiconductor device structure 500 is similar to the semiconductor device structure 100 of FIG. 1H, except that the semiconductor device structure 500 has an asymmetric structure. The semiconductor device structure 500 does not have the portion P1 of the gate structure G of the semiconductor device structure 100 of FIG. 1H, in accordance with some embodiments.

In accordance with some embodiments, semiconductor device structures and methods for forming the same are provided. The methods (for forming the semiconductor device structure) form a gate structure penetrating into a semiconductor substrate to separate a source region from a drain region in the semiconductor substrate. Therefore, the gate length is reduced and the break down voltage and the threshold voltage are maintained.

In accordance with some embodiments, a semiconductor device structure is provided. The semiconductor device structure includes a semiconductor substrate having a top surface, a source region, and a drain region. The semiconductor device structure includes a gate structure over the top surface and extending into the semiconductor substrate. The gate structure in the semiconductor substrate is between the source region and the drain region and separates the source region from the drain region. The semiconductor device structure includes an isolation structure in the semiconductor substrate and surrounding the source region, the drain region, and the gate structure in the semiconductor substrate.

In accordance with some embodiments, a semiconductor device structure is provided. The semiconductor device structure includes a semiconductor substrate having a top surface, a source region, and a drain region. The semiconductor device structure includes a gate structure over the top surface and extending into the semiconductor substrate. The gate structure has a first portion and a second portion. The first portion and the second portion extend into the semiconductor substrate. The first portion and the second portion are between the source region and the drain region and separate the source region from the drain region. The semiconductor device structure includes an isolation structure in the semiconductor substrate and surrounding the source region, the drain region, the first portion, and the second portion.

In accordance with some embodiments, a method for forming a semiconductor device structure is provided. The method includes forming a first trench in a semiconductor substrate. The semiconductor substrate has a top surface. The method includes forming a first gate structure over the top surface and in the first trench. The method includes forming a source region and a drain region in the semiconductor substrate. The first trench is between the source region and the drain region and separates the source region from the drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate having a top surface, a source region, and a drain region;
a gate structure comprising a gate dielectric layer and a gate electrode over the gate dielectric layer, and the gate structure is over the top surface and having an extending portion extending into the semiconductor substrate, wherein the extending portion is between the source region and the drain region and separates from the source region and the drain region, and the source region and the drain region are separated from the gate dielectric layer of the extending portion by a portion of the semiconductor substrate, and wherein a first distance between the extending portion and the source region is different from a second distance between the extending portion and the drain region; and
an isolation structure in the semiconductor substrate and surrounding the source region, the drain region, and the extending portion.

2. The semiconductor device structure as claimed in claim 1, wherein a first portion of the extending portion has a side, a second portion of the gate structure over the top surface and on the side has a length, and a first distance between a first bottom surface of the first portion and the top surface is greater than the length.

3. The semiconductor device structure as claimed in claim 2, wherein the first distance is greater than a thickness of the second portion.

4. The semiconductor device structure as claimed in claim 2, wherein a second distance between a second bottom surface of the isolation structure and the top surface is substantially equal to the first distance.

5. The semiconductor device structure as claimed in claim 1, further comprising:
a spacer layer surrounding the gate structure over the top surface and not surrounding the gate structure in the semiconductor substrate.

6. The semiconductor device structure as claimed in claim 1, wherein the isolation structure is in direct contact with a portion of the extending portion, and a first sidewall of the isolation structure and a second sidewall of the portion of the extending portion face to each other.

7. The semiconductor device structure as claimed in claim 1, wherein the gate structure has a T-shaped cross section.

8. The semiconductor device structure as claimed in claim 1, wherein a first portion of the extending portion has a first width, a second portion of the gate structure over the top surface has a second width, and the second width is greater than the first width.

9. The semiconductor device structure as claimed in claim 1, further comprising:
a work function metal layer between the gate dielectric layer and the gate electrode layer.

10. The semiconductor device structure as claimed in claim 1, wherein a portion of a top surface of the isolation structure is covered by the gate dielectric layer.

11. A semiconductor device structure, comprising:
a semiconductor substrate having a top surface, a source region, and a drain region;
a gate structure over the top surface and extending into the semiconductor substrate, wherein the gate structure has a first portion and a second portion extending into the semiconductor substrate, the first portion is connected to the second portion by a third portion of the gate structure over the top surface, the first portion and the second portion are between the source region and the drain region and separate from the source region and the drain region; and
an isolation structure in the semiconductor substrate and surrounding the source region, the drain region, the first portion, and the second portion, wherein a first bottom surface of the first portion and a second bottom surface of the second portion are both higher than a third bottom surface of the isolation structure, and the first portion and the second portion are in direct contact with the isolation structure.

12. The semiconductor device structure as claimed in claim 11, wherein the first portion has a side, a fourth portion of the gate structure over the top surface and on the side has a length, and a first distance between the first bottom surface of the first portion and the top surface is greater than the length.

13. The semiconductor device structure as claimed in claim 12, wherein the first distance is greater than a thickness of the fourth portion.

14. The semiconductor device structure as claimed in claim 11, further comprising:
a spacer layer surrounding the gate structure over the top surface and not surrounding the gate structure in the semiconductor substrate.

15. The semiconductor device structure as claimed in claim 11, wherein the first portion has a first length, the second portion has a second length, the third portion of the gate structure over the top surface has a third length, and the third length is greater than a sum of the first length and the second length.

16. A semiconductor device structure, comprising:
a semiconductor substrate having a top surface, a source region, and a drain region;
a gate structure over the top surface and having an extending portion extending into the semiconductor substrate, wherein the source region and the drain region are located at opposite sides of the extending portion; and
an isolation structure in the semiconductor substrate and surrounding the source region, the drain region, and the extending portion, wherein a first distance between the extending portion and the source region is different from a second distance between the extending portion and the drain region.

17. The semiconductor device structure as claimed in claim 16, wherein the gate structure has an L-shaped cross section.

18. The semiconductor device structure as claimed in claim 16, wherein the gate structure is partially located directly over the isolation structure.

19. The semiconductor device structure as claimed in claim 16, wherein a first sidewall of the isolation structure is in direct contact with a second sidewall of the extending portion.

20. The semiconductor device structure as claimed in claim 16, further comprising:
a spacer layer surrounding the gate structure over the top surface and not surrounding the extending portion.

\* \* \* \* \*